(12) United States Patent
Naito

(10) Patent No.: US 9,406,666 B2
(45) Date of Patent: Aug. 2, 2016

(54) SEMICONDUCTOR DEVICE

(71) Applicant: FUJI ELECTRIC CO., LTD., Kawasaki-shi (JP)

(72) Inventor: Tatsuya Naito, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/817,074

(22) Filed: Aug. 3, 2015

(65) Prior Publication Data
US 2015/0340356 A1 Nov. 26, 2015

Related U.S. Application Data

(63) Continuation of application No. PCT/JP2014/057011, filed on Mar. 14, 2014.

(30) Foreign Application Priority Data

Mar. 14, 2013 (JP) .................... 2013-051271

(51) Int. Cl.
| | | |
|---|---|---|
| H01L 29/861 | (2006.01) |
| H01L 31/07 | (2012.01) |
| H01L 29/70 | (2006.01) |
| H01L 21/8222 | (2006.01) |
| H01L 27/02 | (2006.01) |

(Continued)

(52) U.S. Cl.
CPC ........ *H01L 27/0255* (2013.01); *H01L 29/0619* (2013.01); *H01L 29/405* (2013.01); *H01L 29/7395* (2013.01); *H01L 29/861* (2013.01); *H01L 29/866* (2013.01)

(58) Field of Classification Search
CPC ............... H01L 29/8611; H01L 2924/13055; H01L 29/0615; H01L 29/7811; H01L 29/0692; H01L 27/0255; H01L 29/66136; H01L 29/66106; H01L 29/7393; H01L 29/7455; H01L 29/866
USPC ......... 257/355, 367, 401, 481, 484, 575, 603, 257/605; 438/328, 369, 372, 373
See application file for complete search history.

(56) References Cited

U.S. PATENT DOCUMENTS

| | | |
|---|---|---|
| 4,573,066 A | 2/1986 | Whight |
| 5,324,971 A | 6/1994 | Notley |

(Continued)

FOREIGN PATENT DOCUMENTS

| | | |
|---|---|---|
| JP | 59-110164 A | 6/1984 |
| JP | H06-69423 A | 3/1994 |

(Continued)

*Primary Examiner* — Hsien Ming Lee
(74) *Attorney, Agent, or Firm* — Rabin & Berdo, P.C.

(57) ABSTRACT

A protective diode is provided above a first guard ring region which surrounds an active region, with a field oxide film interposed there between. The protective diode may include a series pn zener diode in which a p+ layer and an n− layer are adjacent to each other. In a semiconductor device having the first guard ring region provided below the protective diode, cracks in the surface protective film may be prevented by providing a surface protective film that may be a polyimide film. The first guard ring region is provided below the protective diode and is connected to a second guard ring region that is provided in a portion other than the portion provided below the protective diode through a third guard ring region which is an intermediate region (R). Thus, when a surge voltage is applied, concentration of electric field on the outermost guard ring may be reduced.

20 Claims, 22 Drawing Sheets

(51) Int. Cl.
  *H01L 29/866* (2006.01)
  *H01L 29/40* (2006.01)
  *H01L 29/06* (2006.01)
  *H01L 29/739* (2006.01)

(56) References Cited

U.S. PATENT DOCUMENTS

| | | | |
|---|---|---|---|
| 5,994,754 A | | 11/1999 | Hayashi et al. |
| 6,407,413 B1 | | 6/2002 | Kawamoto |
| 6,762,440 B1 | * | 7/2004 | Pairitsch ............. H01L 27/0255 257/173 |
| 6,965,150 B2 | * | 11/2005 | Higashida ........... H01L 27/0255 257/173 |
| 2002/0050603 A1 | | 5/2002 | Kawamoto |
| 2005/0167694 A1 | | 8/2005 | Takahashi |
| 2013/0020587 A1 | | 1/2013 | Hino et al. |
| 2013/0033300 A1 | | 2/2013 | Okada et al. |

FOREIGN PATENT DOCUMENTS

| | | |
|---|---|---|
| JP | H08-88354 A | 4/1996 |
| JP | H09-186315 A | 7/1997 |
| JP | 10-200090 A | 7/1998 |
| JP | H11-243200 A | 9/1999 |
| JP | 2001-217420 A | 8/2001 |
| JP | 2002-141357 A | 5/2002 |
| JP | 2005-217152 A | 8/2005 |
| JP | 2011-254012 A | 12/2011 |
| JP | 2012-109602 A | 6/2012 |
| JP | 2013-008807 A | 1/2013 |

* cited by examiner

SEMICONDUCTOR DEVICE

CROSS-REFERENCE TO RELATED APPLICATION(S)

This non-provisional application for U.S. Letters Patent is a Continuation of International Application PCT/JP2014/057011 filed Mar. 14, 2014, which claims priority from JP PA 2013-051271 filed Mar. 14, 2013, the entire contents of both of which are hereby incorporated by reference.

BACKGROUND OF THE INVENTION

1. Field of the Invention

The present invention relates to a semiconductor device.

2. Background of the Related Art

In some cases, an external surge voltage or a noise voltage and a surge voltage, such as electromagnetic noise which is generated by the operation of a power semiconductor element, are applied to a power semiconductor element, such as an insulated gate bipolar transistor (IGBT). A protective diode clamps an overvoltage including the external surge voltage or the noise voltage and the surge voltage, such as the electromagnetic noise, to prevent the overvoltage from being applied to the power semiconductor element. In this way, a semiconductor device having the power semiconductor element formed therein has a high breakdown resistance.

The semiconductor device having the power semiconductor element formed therein is mounted in, for example, an internal combustion engine ignition device. The circuit structure of a main portion of the internal combustion engine ignition device will be described. FIG. 9 is a circuit diagram illustrating the circuit structure of the main portion of an internal combustion engine ignition device 600. In FIG. 9, a portion surrounded by a rectangular frame Q is a semiconductor device 500 in which an IGBT 503 which is a power semiconductor element and a peripheral circuit for controlling the IGBT 503 are formed on the same semiconductor substrate 601. The semiconductor device 500 functions as, for example, an igniter that controls the flow of a low-voltage current to a primary coil 505 of an ignition coil. The IGBT 503 forms a switch that controls the flow of the low-voltage current to the primary coil 505.

In FIG. 9, when an on signal is input from a gate driving circuit 501, it is input to a gate of the IGBT 503 through a gate resistor 502. Then, the gate potential of the IGBT 503 increases and the IGBT 503 is turned on. When the IGBT 503 is turned on, a current flows from a battery 504 to the primary coil 505. Meanwhile, when an off signal is input from the gate driving circuit 501, the IGBT 503 is turned off and the potential of a collector C increases. Then, the flow of the current to the primary coil 505 is cut and the voltage of the primary coil 505 increases. Then, a high voltage corresponding to the turn ratio is generated in a secondary coil 506 and discharge occurs in the gap of a spark plug 507 to start the engine.

A protective diode 508 which is connected between the collector C and the gate G of the IGBT 503 clamps a high voltage which is applied to the collector C of the IGBT 503 when the IGBT 503 is turned off to prevent an overvoltage from being applied to the IGBT 503.

When the protective diode 508 reaches a clamping voltage, a clamping current Icl flows to the protective diode 508. The clamping current Icl flows to a ground GND through the gate resistor 502 and a zener diode 509 to increase the gate potential of the IGBT 503. When the gate potential of the IGBT 503 increases, the IGBT 503 is turned on and a clamping current Icl which flows to the primary coil 505 flows to the ground GND through the IGBT 503. As such, when the current which flows to the primary coil 505 flows to the ground GND, a large amount of energy stored in the primary and secondary coils 505 and 506 diverges.

Next, the structure of the semiconductor device 500 will be described. FIG. 10 is a diagram illustrating the structure of the semiconductor device 500 according to the related art. FIG. 10(a) is a plan view illustrating a main portion of the semiconductor device 500 according to the related art and FIG. 10(b) is a cross-sectional view illustrating the cross-sectional structure of the main portion taken along the line Y-Y of FIG. 10(a). The semiconductor device 500 includes a p-type collector region 52, an n-type buffer region 53 that is provided on the p-type collector region 52, and an n-type drift region 54 (n− region) that is provided on a surface of the n-type buffer region 53 which is opposite to the p-type collector region 52.

A p base region is selectively provided in a surface layer of the surface of the n-type drift region 54 which is opposite to the n-type buffer region 53 (a p-type well region 55 connected to a portion (hereinafter, referred to as an extension portion) of the p-type base region which extends from an active region 71 to the outside (the outer circumference of a chip) is illustrated in FIG. 10). In addition, a ring-shaped p-type guard ring region 56 is provided outside the p-type base region 55 in the surface layer of the surface of the n-type drift region 54 which is opposite to the n-type buffer region 53 so as to surround the active region 71. An IGBT and a protective diode 60 which are formed in the semiconductor device 500 correspond to the IGBT 503 and the protective diode 508 in the circuit diagram illustrated in FIG. 9, respectively.

An n-type emitter region (an n-type layer 57 which is connected to an extension portion of an n-type emitter region is illustrated in FIG. 10) is provided in the p-type base region. A MOS gate (an insulated gate including metal, an oxide film, and a semiconductor) structure including the p-type base region, the n-type emitter region, a gate insulating film, and a gate electrode (not illustrated) is provided on the side of the n-type drift region 54 which is close to the front surface of the chip. An emitter electrode 58 is electrically connected to the p-type base region (p-type well region 55) and the n-type emitter region (n-type layer 57). A collector electrode 52a is provided on the rear surface of the semiconductor device 500 so as to be electrically connected to the p-type collector region 52.

In addition, an oxide film 59 that is provided on the p-type guard ring region 56 and a protective diode 60 that is provided with the oxide film 59 interposed therebetween, are provided on the front surface of the semiconductor device 500. The protective diode 60 is provided on a field oxide film 59a which is a thick portion of the oxide film 59 formed on the p-type guard ring region 56. One end of the protective diode 60 is connected to a stopper electrode 61 in which a collector potential is reflected through an n+ layer 72. The other end of the protective diode 60 is connected to a gate wire 63 through the n+ layer 72. The gate wire 63 is a metal wire that is connected to a gate electrode (not illustrated) which is made of polysilicon (poly-Si) and a gate pad electrode 62 made of a metal film.

A boron phosphorus silicate glass (BPSG) film 64 and a resistive silicon nitride film (resistive SiN film) 65 are provided as a surface protective film on the protective diode 60. In addition, an n-type stopper region 66 is provided outside the p-type guard ring region 56 in the surface layer of the surface of the n-type drift region 54 which is opposite to the n-type buffer region 53 so as to be connected to the stopper electrode 61. A scribe region 67 is provided outside the n-type stopper region 66. For example, the p-type collector region 52, the n-type buffer region 53, the n-type drift region 54 (n− region 54a), the p-type base region (p-type well region 55), the n-type emitter region (n-type layer 57), the p-type guard ring region 56, and the n-type stopper region 66 are formed on an n-type semiconductor substrate 51 (semiconductor chip 80).

A plurality of series pn zener diodes 68 are provided in the protective diode 60 such that p+ layers 69 and n− layers 70 are alternately arranged from the active region 71 to the outer circumference of the chip. The series pn zener diode 68 is a junction of the p+ layer 69 and the n− layer 70. The series pn zener diodes 68 forming the protective diode 60 has a function of equally widening the gap between equipotential lines in the n− region 54a (the extension portion of the n-type drift region 54) between the p-type guard ring region 56 and the n-type stopper region 66. The p+ layers 69 are disposed in portions of the protective diode 60 which are closest to the active region 71 and the outer circumference of the chip and come into contact with the n+ layer 72.

The resistive SiN film 65 functions as a field plate. The field plate forming the resistive SiN film 65 is less likely to be affected by surface charge and can reduce the length of a termination structure region 500a (the width of the termination structure region 500a in a direction from the active region 71 to the chip outer circumference) which surrounds the active region 71 in the semiconductor device 500. A portion of the termination structure region 500a including a region in which the protective diode 60 is formed has a rectangular shape in a plan view which is convex toward to the inside of the chip and has a larger width than the other portion of the termination structure region 500a (a region in which the protective diode 60 is not formed). In an intermediate region F between the region in which the protective diode 60 is formed and the region in which the protective diode 60 is not formed, the breakdown voltage is likely to be reduced by the concentration of the electric field since the breakdown voltage is different and a depletion layer is spread in a different way.

However, since the resistive SiN film 65 is formed, the concentration of the electric field is reduced in the intermediate region F and a sufficient breakdown voltage is insured. As a semiconductor device in which a protective diode and a power semiconductor element are formed on the same semiconductor substrate, a structure has been disclosed in which a zener diode connected between a gate and a collector is made of polysilicon and is formed above a guard ring in a termination structure region of an IGBT, with an interlayer insulating film interposed there between (for example, see Patent Document 1: JP 2001-217420 A; Patent Document 2: JP 2002-141357 A; Patent Document 3: JP 8-88354 A; and Patent Document 4: JP 9-186315 A).

However, in the related art, for example, in the semiconductor device 500 according to the related art illustrated in FIG. 10, in some cases, a crack occurs in the resistive SiN film 65 after a temperature cycle test due to a difference in thermal expansion coefficient between the resistive SiN film 65 and an aluminum (Al) electrode (the emitter electrode 58, the gate wire 63, and the stopper electrode 61). In addition, there is a problem that the Al electrode or the resistive SiN film 65 is corroded by a temperature-humidity-bias (THB) test, characteristics are changed, and reliability is reduced. In addition, the resistive SiN film 65 has a large production tolerance and is likely to have an adverse effect on electrical characteristics.

The above-mentioned Patent Documents 1 to 3 disclose the structure in which the protective diode is provided above the p-type guard ring region, but do not disclose a means for reducing the concentration of the electric field on the outermost p-type guard ring region.

The invention has been made to solve the above-mentioned problems of the related art and an object of the invention is to provide a semiconductor device which can reduce the concentration of the electric field on a guard ring region and is covered with a surface protective film, without using a resistive SiN film.

SUMMARY OF THE INVENTION

In order to solve the above-mentioned problems and achieve the object of the invention, a semiconductor device according to an aspect of the invention has the following characteristics. A semiconductor element that includes an active region in which a main current flows and a termination structure region which surrounds the active region is provided on a semiconductor substrate of a first conductivity type. A protective diode is provided above the termination structure region, with an insulating film interposed therebetween. One or more diffusion layers (also called guard rings) of a second conductivity type are selectively provided in a surface layer of a surface of the semiconductor substrate, which comes into contact with the insulating film, so as to surround the active region in the termination structure region. A surface protective film that covers the termination structure region is provided. The protective diode includes a plurality of diodes which are formed by alternately arranging first-conductivity-type semiconductor layers and second-conductivity-type semiconductor layers so as to be adjacent to each other in a direction from the active region to the outside. One end of the protective diode is electrically connected to a high-potential electrode which is provided on an outer circumferential side of the semiconductor element. The other end of the protective diode is electrically connected to a gate wire of the semiconductor element which is provided on the active region side. The one end of the protective diode is disposed outside an outer circumferential end of the outermost diffusion layer.

In the semiconductor device according to the above-mentioned aspect of the invention, in the diffusion layer, a portion which faces the protective diode and a remaining portion may be connected to each other.

In the semiconductor device according to the above-mentioned aspect of the invention, a portion that connects the portion of the diffusion layer which faces the protective diode and the remaining portion of the diffusion layer may have a curved shape in a plan view.

In the semiconductor device according to the above-mentioned aspect of the invention, a width of the portion of the diffusion layer which faces the protective diode may be greater than a width of the remaining portion of the diffusion layer.

The semiconductor device according to the above-mentioned aspect of the invention further has the following characteristics. Two or more diffusion layers may be arranged at a predetermined interval in the direction from the active region to the outside. A gap between portions of the diffusion layers which face the protective diode and are adjacent to each other may be greater than a gap between the remaining portions of the diffusion layers which are adjacent to each other.

In the semiconductor device according to the above-mentioned aspect of the invention, a surface area of the remaining portion other than a portion of the diffusion layer which faces the protective diode may be greater than a surface area of the portion of the diffusion layer which faces the protective diode.

The semiconductor device according to the above-mentioned aspect of the invention further has the following characteristics. Two or more diffusion layers may be arranged at a predetermined interval in the direction from the active region to the outside. The first-conductivity-type semiconductor layer or the second-conductivity-type semiconductor layer may be provided above a surface of a portion of the semiconductor substrate which is interposed between the adjacent diffusion layers, with the insulating film interposed therebetween.

In the semiconductor device according to the above-mentioned aspect of the invention, the diode may be a zener diode.

In the semiconductor device according to the above-mentioned aspect of the invention, the protective diode may be made of polysilicon.

In the semiconductor device according to the above-mentioned aspect of the invention, the surface protective film may be made of a polyimide-based resin.

In the semiconductor device according to the above-mentioned aspect of the invention, the semiconductor element may be an insulated gate bipolar transistor or an insulated gate field effect transistor.

In the semiconductor device according to the invention in which the guard rings (portions of the guard ring regions which are arranged on the semiconductor substrate side of the protective diode) are provided below the protective diode, since the polyimide film is provided as the surface protective film, it is possible to form the surface protective film, without using a resistive SiN film. Therefore, it is possible to prevent the occurrence of cracks in the surface protective film, to prevent a reduction in reliability, or to prevent an adverse effect on electrical characteristics. In addition, according to the semiconductor device of the invention, since the guard rings are provided below the protective diode, it is possible to reduce the concentration of the electric field on the outermost guard ring below the protective diode when a surge voltage is applied.

DETAILED DESCRIPTION OF THE INVENTION

Figure 1:
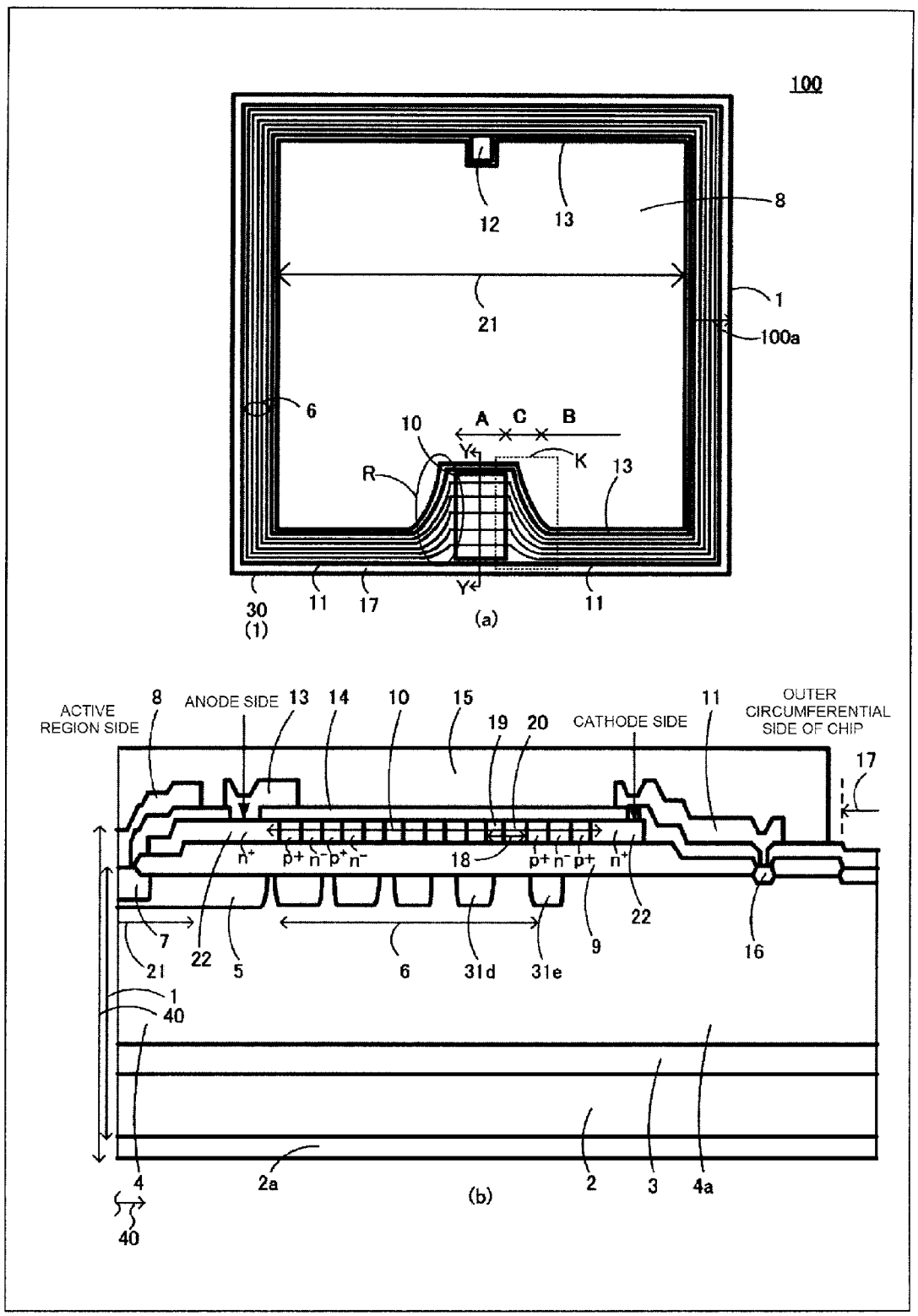
FIG. 1 is a diagram illustrating the structure of a semiconductor device 100 according to a first example of the invention.

Hereinafter, preferred embodiments of a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In addition, a guard ring region is a p type unless otherwise noted.

Embodiment 1

Figure 9:
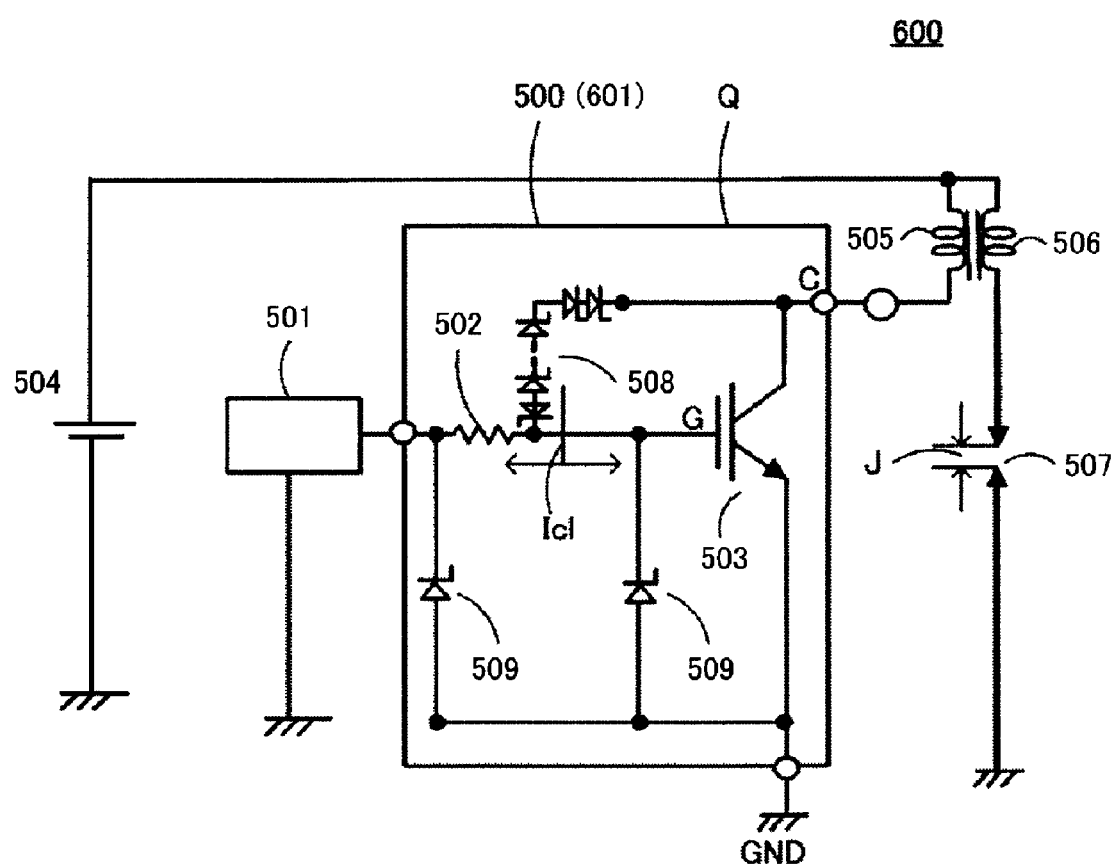
FIG. 9 is a circuit diagram illustrating the circuit structure of a main portion of an internal combustion engine ignition device 600.

A semiconductor device 100 according to Embodiment 1 will be described with reference to FIGS. 1 and 9. FIG. 1 is a diagram illustrating the structure of the semiconductor device 100 according to a first example of the invention. FIG. 1(a) is a plan view illustrating a main portion of the semiconductor device 100 according to Embodiment 1. FIG. 1(b) is a cross-sectional view illustrating a main portion of a cross-sectional structure taken along the line Y-Y of FIG. 1(a). The semiconductor device 100 according to Embodiment 1 illustrated in FIG. 1 functions as, for example, an igniter which controls a low-voltage current flowing to a primary coil 505 of an ignition coil of an internal combustion engine ignition device 600 illustrated in FIG. 9.

Specifically, as illustrated in FIG. 1, the semiconductor device 100 according to Embodiment 1 includes, for example, an IGBT 40 which is a power semiconductor element, a protective diode 10, a gate resistor 502 (not illustrated), and a zener diode 509 (not illustrated), which are provided on the same semiconductor substrate. The IGBT 40 forms a switch which controls the flow of the low-voltage current to the primary coil 505. The protective diode 10 has a function of protecting the IGBT 40 from an overvoltage, such as a surge voltage. The IGBT 40 and the protective diode 10 correspond to an IGBT 503 and a protective diode 508 in the circuit diagram illustrated in FIG. 9.

The power semiconductor element forming the semiconductor device 100 according to Embodiment 1 may be an insulated gate field effect transistor (metal oxide semiconductor field effect transistor: MOSFET), instead of the IGBT 40. In this case, a p-type collector region 2, which will be described below, may be replaced with an n-type drain region. Hereinafter, the IGBT 40 and the protective diode 10 mounted on the IGBT 40 in the semiconductor device 100 according to Embodiment 1 will be described.

The semiconductor device 100 according to Embodiment 1 includes a p-type collector region 2, a n-type buffer region 3 that is provided on the p-type collector region 2, and an n-type drift region 4 that is provided on a surface of the n-type buffer region 3 opposite to the p-type collector region 2 (including an n− region 4a (an extension portion of the n-type drift region 4) which is a portion of the n-type drift region 4 that extends from an active region 21 to the outer circumference of a chip). A p-type base region 5 (a portion (extension portion) of the p-type base region 5 which extends from the active region 21 to the outer circumference of the chip is illustrated in FIG. 1(b)) is selectively provided in a surface layer of the n-type drift region 4 which is opposite to the n-type buffer region 3. A p-type base region end portion 5a forms the boundary between the active region 21 and a termination structure region 100a. A region which extends from the p-type base region end portion 5a to the inner circumference of the chip is the active region 21 and a region which extends from the p-type base region end portion 5a to the outer circumferential end of the chip is the termination structure region 100a.

A plurality of p-type guard ring regions 6 (five p-type guard ring regions 6 in this embodiment) forming the termination structure region 100a are provided in the surface layer of the n-type drift region 4, which is opposite to the n-type buffer region 3, outside the p-type base region 5. The plurality of p-type guard ring regions 6 are arranged in parallel in a ring shape surrounding the active region 21 in the termination structure region which surrounds the active region 21. The surface doping concentration of the p-type guard ring region 6 is, for example, 1×10$^{18}$/cm$^3$ and the depth of the p-type guard ring region 6 is 4 μm. The termination structure region has a function of reducing the electric field of the n-type drift region 4 on the front surface side of the substrate and holding a breakdown voltage.

An n-type emitter region (an extension portion of an n-type emitter region 7 is illustrated in FIG. 1(b)) is provided in the p-type base region 5. A MOS gate structure including the p-type base region 5, the n-type emitter region 7, a gate insulating film (not illustrated), and a gate electrode (not illustrated) are arranged on the side of the n-type drift region 4 which is close to the front surface of the chip. An emitter electrode 8 is electrically connected to the p-type base region 5 and the n-type emitter region 7. A collector electrode 2a is provided on the rear surface of the semiconductor device 100 so as to be electrically connected to the p-type collector region 2.

A field oxide film 9 which is arranged on the p-type guard ring region 6 and the protective diode 10 which is arranged above the p-type guard ring region 6 (corresponding to a guard ring in claim 1), with the field oxide film 9 interposed therebetween, are provided on the front surface of the semiconductor device 100. One end of the protective diode 10 is connected to a stopper electrode 11 in which a collector potential (a high-potential-side potential) is reflected through an n+ layer 22. The other end of the protective diode 10 is connected to a gate wire 13 through the n+ layer 22. The gate wire 13 is a gate runner metal wire connected to a gate electrode (not illustrated) which is made of polysilicon and a gate pad electrode 12 which is a metal film.

A boron phosphorus silicate glass (BPSG) film 14 and a polyimide (polyimide-based resin) film 15 are provided as a surface protective film on the protective diode 10. An n-type stopper region 16 which is connected to the stopper electrode 11 is provided outside the p-type guard ring region 6. A scribe region 17 is provided outside the n-type stopper region 16. The p-type collector region 2, the n-type buffer region 3, the n-type drift region 4 (the n− region 4a), the p-type base region 5, the n-type emitter region 7, the p-type guard ring region 6, and the n-type stopper region 16 are formed on an n-type semiconductor substrate 1 (semiconductor chip 30) and form the IGBT 40 and the termination structure region 100a of the IGBT 40.

The rated voltage of the IGBT 40 is, for example, 400 V. The breakdown voltage of the IGBT 40 is higher than the rated voltage and is, for example, 600 V. Examples of the MOS gate structure include a planar gate structure and a trench gate structure. The protective diode 10 is formed by a plurality of series pn zener diodes 18. The series pn zener diode 18 has a structure in which a p+ layer 19 and an n− layer 20 are alternately arranged (adjacent) in a direction from the active region 21 to the outer circumference of the chip. The p+ layer 19 and the n− layer 20 are made of polysilicon. The detailed structure of the protective diode 10 will be described below.

A portion of the termination structure region 100a which includes the position where the protective diode 10 is formed has a planar shape in which a portion of the termination structure region 100a is convex toward the inner circumference of the chip and is wider than the other portion of the termination structure region 100a (in which the protective diode 10 is not formed). Each p-type guard ring region 6 is divided into three sections (which are represented by letters A, B, and C). Portions of the p-type guard ring regions 6 in the first section A are first guard ring regions 31 (which are represented by reference numerals 31d and 31e in FIG. 1) which are provided below the protective diode 10 (a surface of the protective diode 10 which faces the semiconductor substrate 1, with the field oxide film 9 interposed therebetween). Portions of the p-type guard ring regions 6 in the second section B are second guard ring regions 32 which will be the termination structure region 100a of the IGBT 40. The second guard ring region 32 in the section B is arranged closer to the outer circumference of the chip than the first and third guard ring regions 31 and 33 in the sections A and C.

A portion of the p-type guard ring region 6 in the third section C is the third guard ring region 33 which is arranged in an intermediate region R between the first guard ring region 31 and the second guard ring region 32. The third guard ring region 33 in the section C connects (mediates between) the first guard ring region 31 in the section A and the second guard ring region 32 in the section B. The third guard ring region 33 in the section C has a curved shape that is convex from a straight line connecting the end of the first guard ring region 31 in the section A and the end of the second guard ring region 32 in the section B to the outer circumference of the chip. The total number of first guard ring regions 31 is five, the total number of second guard ring regions 32 is five, and the total number of third guard ring regions 33 is five in this embodiment. However, the total number is not limited to five, but can be changed to various values.

Figure 2A:
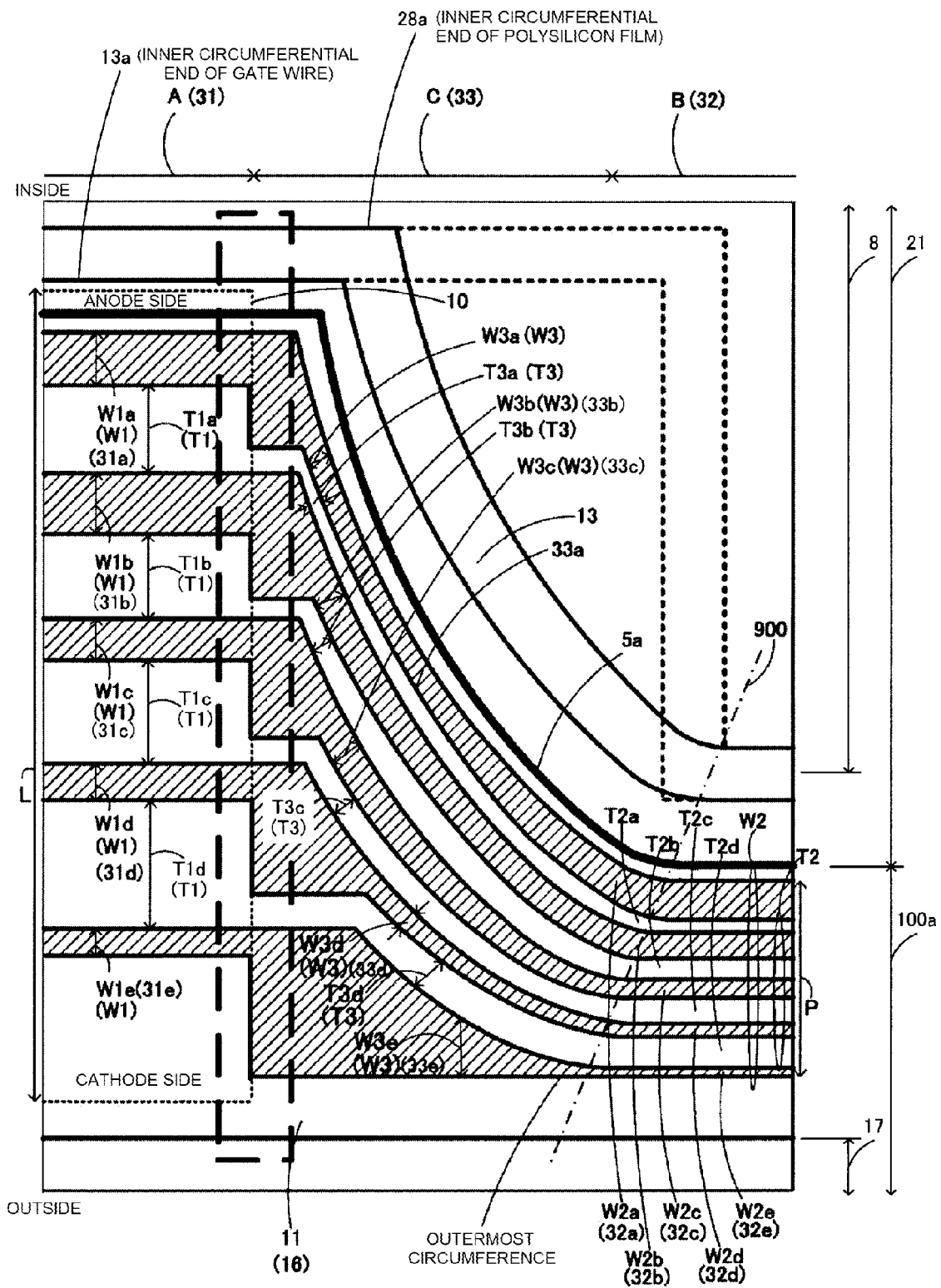
FIG. 2A is an enlarged plan view illustrating the vicinity K of an intermediate region R illustrated in FIG. 1.

The first to third guard ring regions 31 to 33 will be described in detail below. FIG. 2A is an enlarged plan view illustrating the vicinity K of the intermediate region R illustrated in FIG. 1. As described above, five p-type guard ring regions 6 are arranged in parallel so as to surround the active region 21. In addition, as described above, each guard ring of the third guard ring region 33 in the section C (that is, a portion of each p-type guard ring region 6 which will be the third guard ring region 33) has a curved shape which is convex toward the outer circumference of the chip. In addition, the p-type base region end portion 5a which is an end portion (extension portion) of the p-type base region 5 extending from the active region 21 to the outer circumference of the chip has a curved shape which is convex toward the outer circumference of the chip in the section C, similarly to the curve of the third guard ring region 33.

In the section C, the reason why each guard ring of the third guard ring region 33 and the p-type base region end portion 5a are curved so as to be convex toward the outer circumference of the chip is as follows. The section C is a transition region for drawing each guard ring and the p-type base region end portion 5a to the inner circumference of the chip from the section B to the section A on the inner circumferential side of the chip rather than to the section B. Therefore, if each guard ring and the p-type base region end portion 5a shift from the section B to the section C in a rectangular shape, each guard ring and the p-type base region end portion 5a have a rectangular angular portion which is convex toward the outer circumference of the chip at the boundary between the section B and the section C due to a portion with a predetermined angle (the third guard ring region 33, the second guard ring region 32, a portion of the p-type base region end portion 5a along the third guard ring region 33, and a portion of the p-type base region end portion 5a along the second guard ring region 32). When the angular portions of each guard ring and the p-type base region end portion 5a which are convex toward the outer circumference of the chip have a rectangular shape, they locally increase electric field intensity toward the outer circumference of the chip during the spreading of a depletion layer, similarly to four corners of a rectangular semiconductor chip. Therefore, when electric field intensity locally increases in the angular portions of each guard ring and the p-type base region end portion 5a which are convex toward the outer circumference of the chip, avalanche breakdown occurs at the position where electric field intensity locally increases and a current is concentrated, which results in breakdown. For this reason, the angular portions of each guard ring and the p-type base region end portion 5a which are convex toward the outer circumference of the chip may be formed in a curved shape at the boundary between the section B and the section C and the curvature thereof may be minimized.

Similarly, each guard ring in the section C and the p-type base region end portion 5a may have a curved shape which is convex toward the outer circumference of the chip, in order to reduce the curvature of the angular portions of each guard ring and the p-type base region end portion 5a which are convex toward the outer circumference of the chip at the boundary between the section B and the section C. The reason is as follows. When the third guard ring region 33 and a portion of the p-type base region end portion 5a along the third guard ring region 33 are arranged in a straight line perpendicular to, for example, the outer circumferential line of the chip (a side which corresponds to each side of the rectangular semiconductor chip 30 and is parallel to the second guard ring region 32), the curvature of the angular portions of each guard ring and the p-type base region end portion 5a which are convex toward the outer circumference of the chip is large at the boundary between the section B and the section C. When the curvature of the angular portions of each guard ring and the p-type base region end portion 5a which are convex toward the outer circumference of the chip is large at the boundary between the section B and the section C, the curvature of the depletion layer is also large. Therefore, local electric field intensity is increased by the known Poisson's equation. For this reason, in the section C, the guard ring of each third guard ring region 33 and the p-type base region end portion 5a may have a curved shape which is convex toward the outer circumference of the chip.

In order to reduce the curvature of the angular portions of each guard ring and the p-type base region end portion 5a which are convex toward the outer circumference of the chip at the boundary between the section B and the section C, the boundary between the section B and the section C of the guard ring on the inner circumferential side of the chip may be further away from the protective diode 10 than the boundary between the section B and the section C of the guard ring on the outer circumferential side of the chip, in any two of the second guard ring regions 32. For example, the boundary between the section B and the section C of each guard ring and the p-type base region end portion 5a may be set so as to be disposed on a straight line which forms an acute angle with respect to the second guard ring region 32, such as an auxiliary line 900 illustrated in FIG. 2A. In FIG. 2A, the guard rings in the first guard ring regions 31 are denoted by reference numerals 31a to 31e from the inside to the outside and the guard rings in the second guard ring regions 32 are denoted by reference numerals 32a to 32e from the inside to the outside.

Figure 2B:
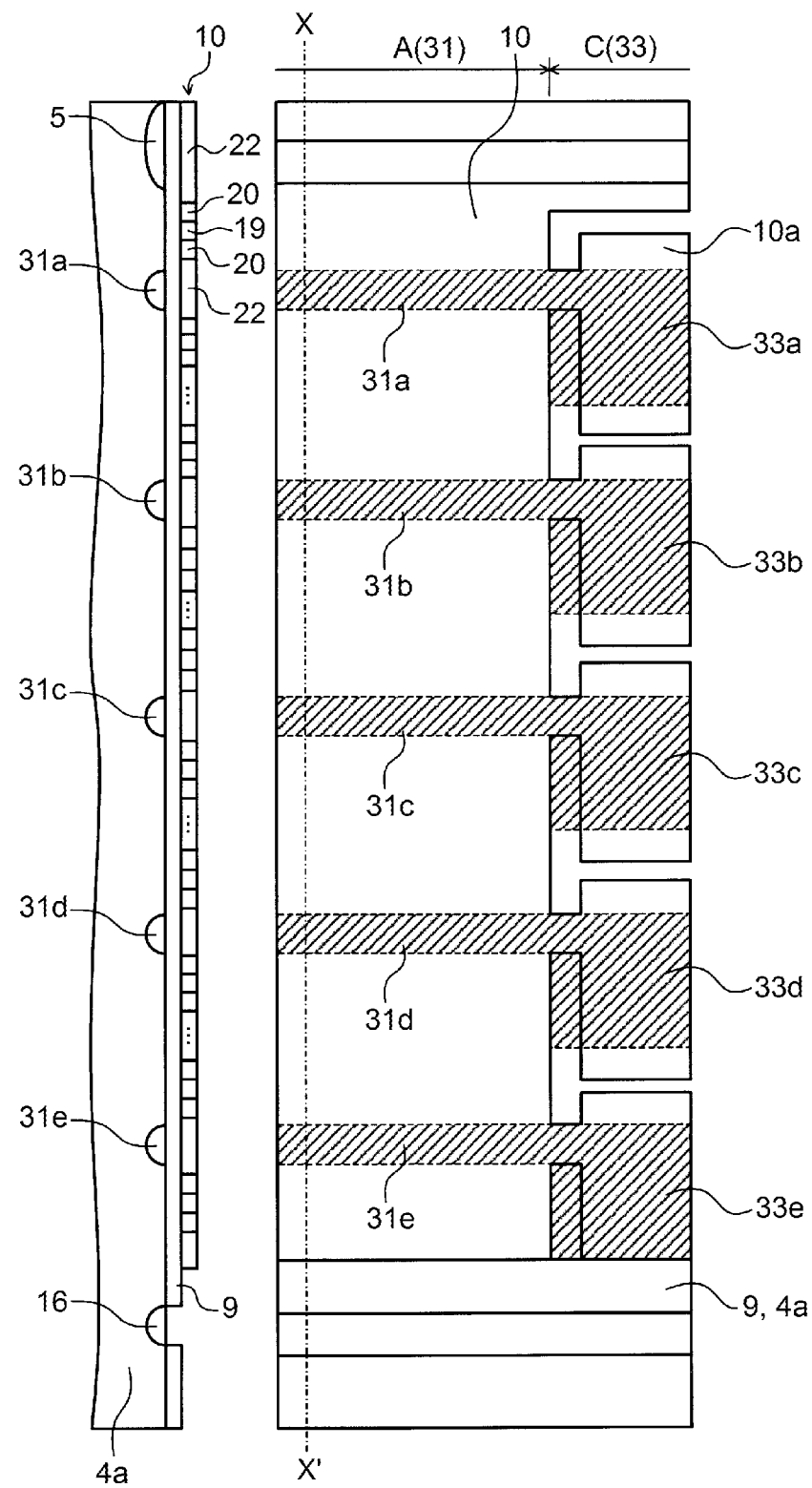
FIG. 2B is an enlarged view illustrating a dashed frame portion illustrated in FIG. 2A.
Figure 12B:
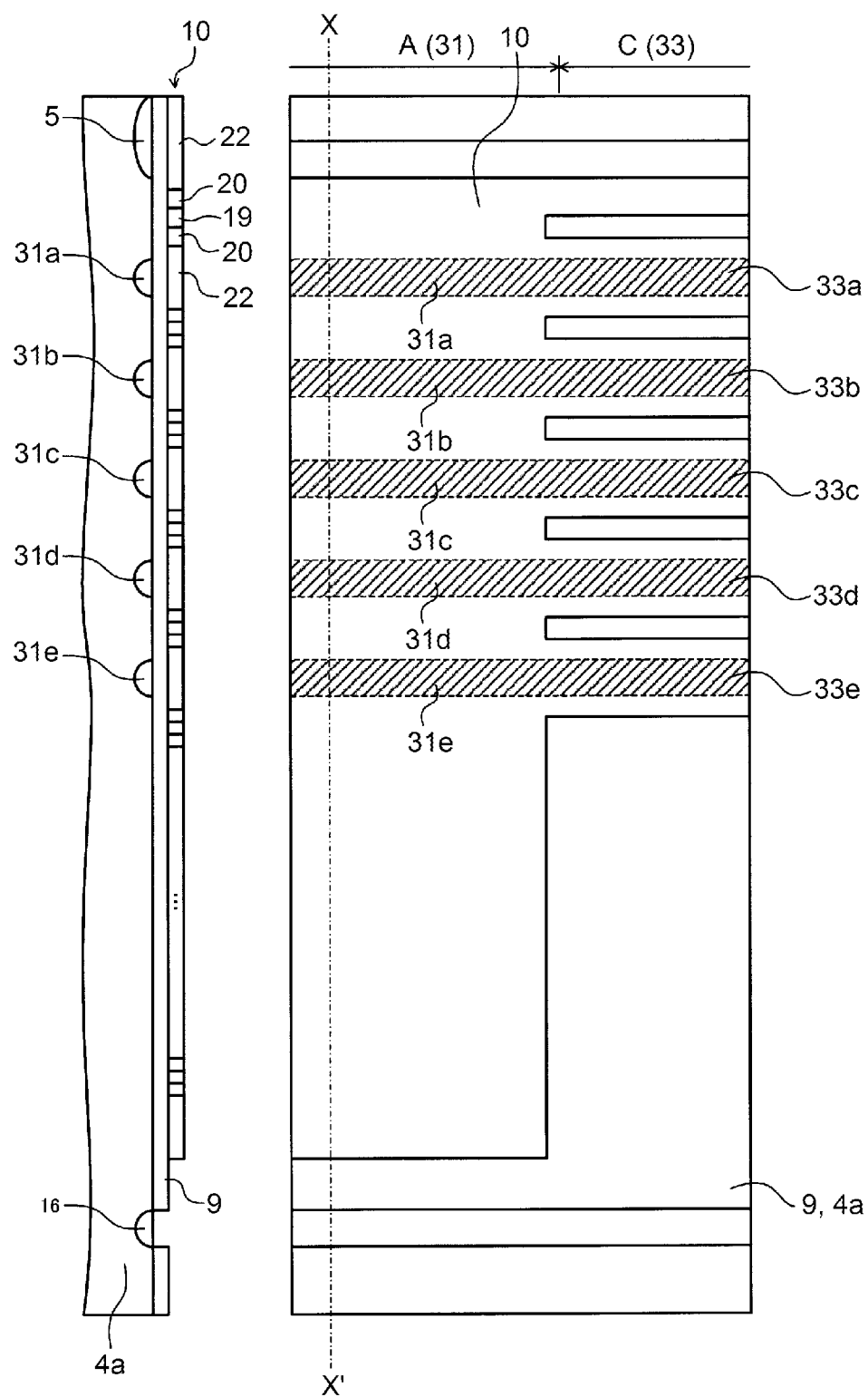
FIG. 12B is an enlarged view illustrating a dashed frame portion illustrated in FIG. 12A.
Figure 12C:
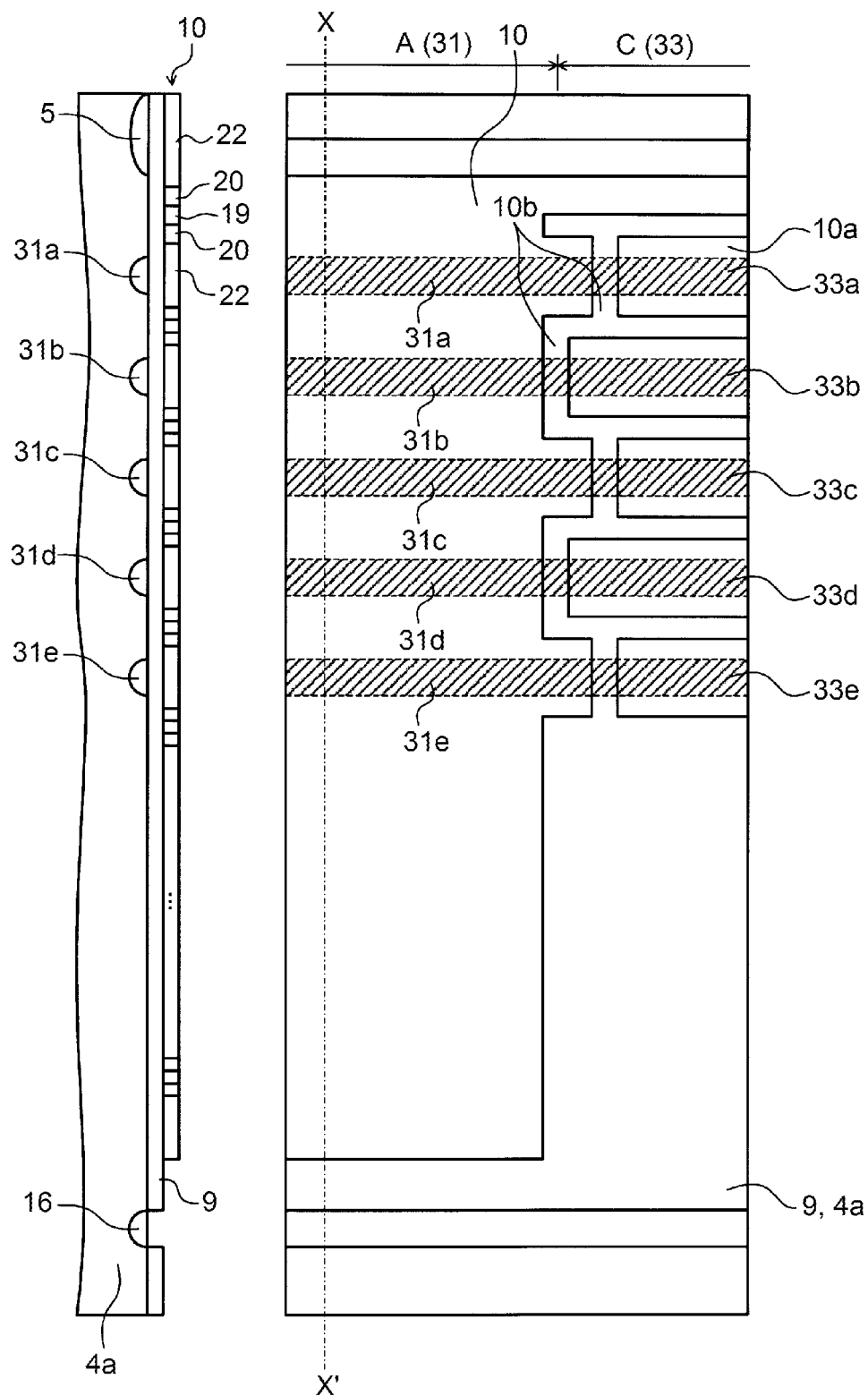
FIG. 12C is an enlarged view illustrating another example of the dashed frame portion illustrated in FIG. 12A.
Figure 12D:
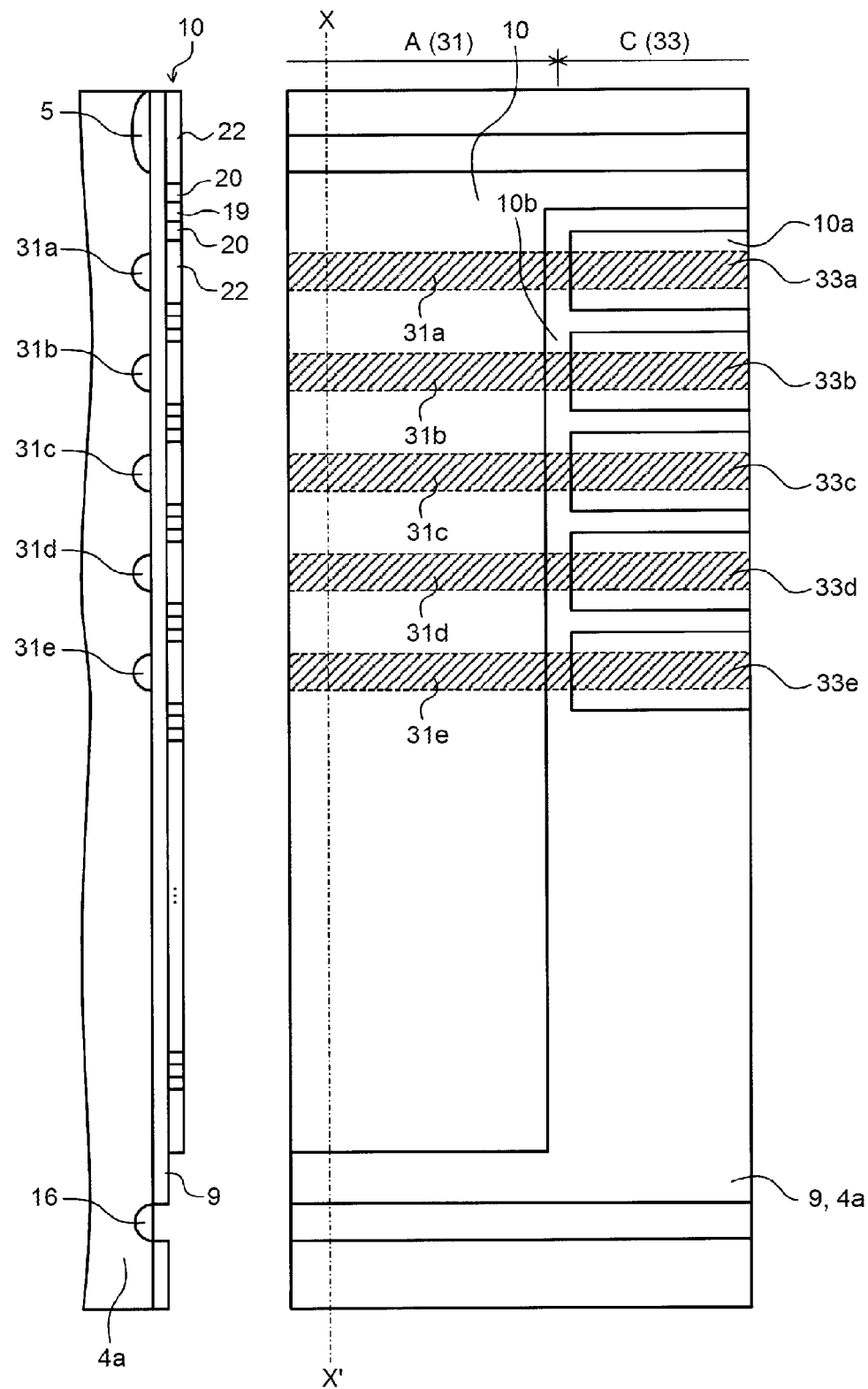
FIG. 12D is an enlarged view illustrating still another example of the dashed frame portion illustrated in FIG. 12A.
Figure 13:
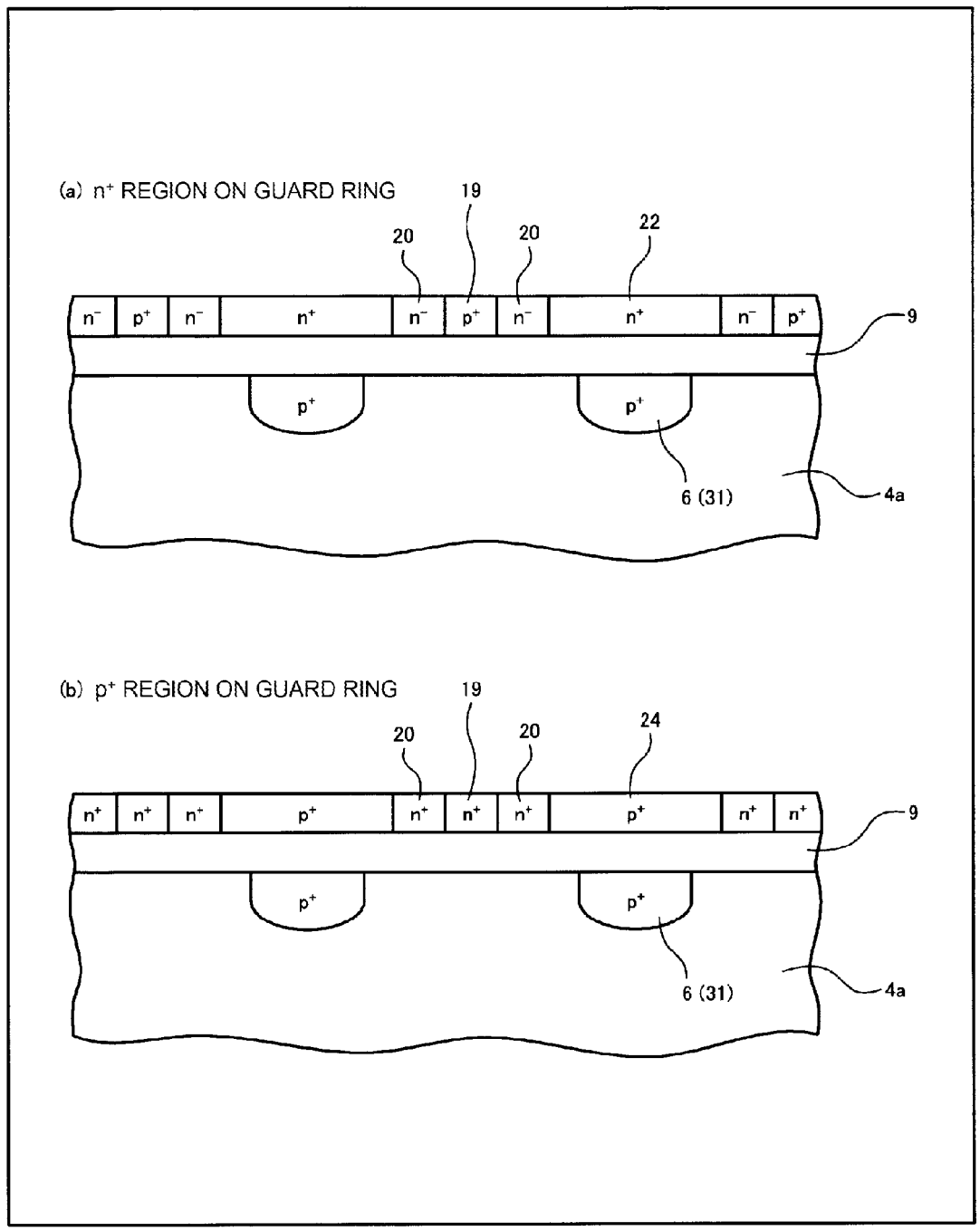
FIG. 13 is an enlarged cross-sectional view illustrating a portion of a cross-sectional structure taken along the line X-X' of FIGS. 2B to 2D and FIGS. 12B to 12D.

Next, the structure of the first and third guard ring regions 31 and 33 in the vicinity of the boundary between the section A and the section C will be described. FIG. 2B is an enlarged view illustrating a dashed frame portion illustrated in FIG. 2A. In FIG. 2B, an enlarged plan view illustrating the dashed frame portion illustrated in FIG. 2A is illustrated on the right side and a cross-sectional view taken along the line X-X' of the plan view is illustrated on the left side (which holds for FIGS. 2C and 2D). The cross-sectional view of FIG. 2B illustrates the protective diode 10, the field oxide film 9 which comes into contact with the lower part (semiconductor substrate side) of the protective diode 10, and the semiconductor substrate (that is, the guard ring and the n− region 4a) which comes into contact with the lower part of the field oxide film 9 (which holds for FIGS. 2C and 2D and FIGS. 12B to 12D). In FIG. 2B, symbol " . . . " means that the p+ layer 19 and the n− layer 20 of the protective diode 10 are repeated. In FIG. 2B, the guard rings in the first guard ring regions 31 are denoted by reference numerals 31a to 31e from the inside to the outside and the guard rings in the third guard ring regions 33 are denoted by reference numerals 33a to 33e from the inside to the outside (which holds for FIGS. 2C and 2D and FIGS. 12B to 12D). FIG. 13(a) is an enlarged cross-sectional view illustrating a portion of the cross-sectional structure (several guard ring portions) taken along the line X-X' of FIG. 2B. FIG. 13 is an enlarged cross-sectional view illustrating a portion of the cross-sectional structure taken along the line X-X' of FIGS. 2B to 2D and FIGS. 12B to 12D.

As illustrated in FIG. 2B, in the protective diode 10, the n+ layer 22 and one or more series pn zener diodes 18 are alternately arranged from the active region 21 to the outer circumference of the chip. Specifically, as illustrated in FIG. 13(a), in the repetitive structure of the protective diode 10, the structures of the n+ layer 22, the n− layer 20, the p+ layer 19, and the n− layer 20 are repeated from the active region 21 to the outer circumference of the chip. The n+ layer 22 is provided in both end portions of the protective diode 10 (a portion closest to the active region 21 and a portion closest to the outer circumference of the chip). In the protective diode 10, the n+ layer 22 is arranged at the position where it faces the p-type base region 5 and the first guard ring regions 31 (that is, the guard rings 31a to 31e), with the field oxide film 9 interposed therebetween. As illustrated in FIG. 13(b), in the protective diode 10, a p+ region 24 may be provided at a position where it faces the p-type base region 5 and the first guard ring regions 31 (that is, the guard rings 31a to 31e), with the field oxide film 9 interposed therebetween.

A gate contact means a contact portion between the n+ layer 22 which forms the protective diode 10 and is made of polysilicon and the gate runner metal wire which is connected to a gate electrode (not illustrated) and a gate pad electrode which is a metal film. Specifically, the gate contact passes through the field oxide film 9 in a depth direction and reaches the front surface of the chip. The p-type base region 5 is exposed through the gate contact. A collector contact means a contact portion between the n-type stopper region 16 which is provided in the outermost circumference of the chip and the stopper electrode 11. Specifically, the collector contact passes through the field oxide film 9 in the depth direction and reaches the front surface of the chip. The p-type base region 5 is exposed through the collector contact. The structure illustrated in FIG. 2B is an example in which the protective diode 10 is connected to a polysilicon field plate 10a provided on each of the guard rings 33a to 33e in the third guard ring regions 33 between the section A and the section B (that is, in the section C). According to this structure, an equipotential surface can be less likely to be affected by external charge.

Figure 2C:
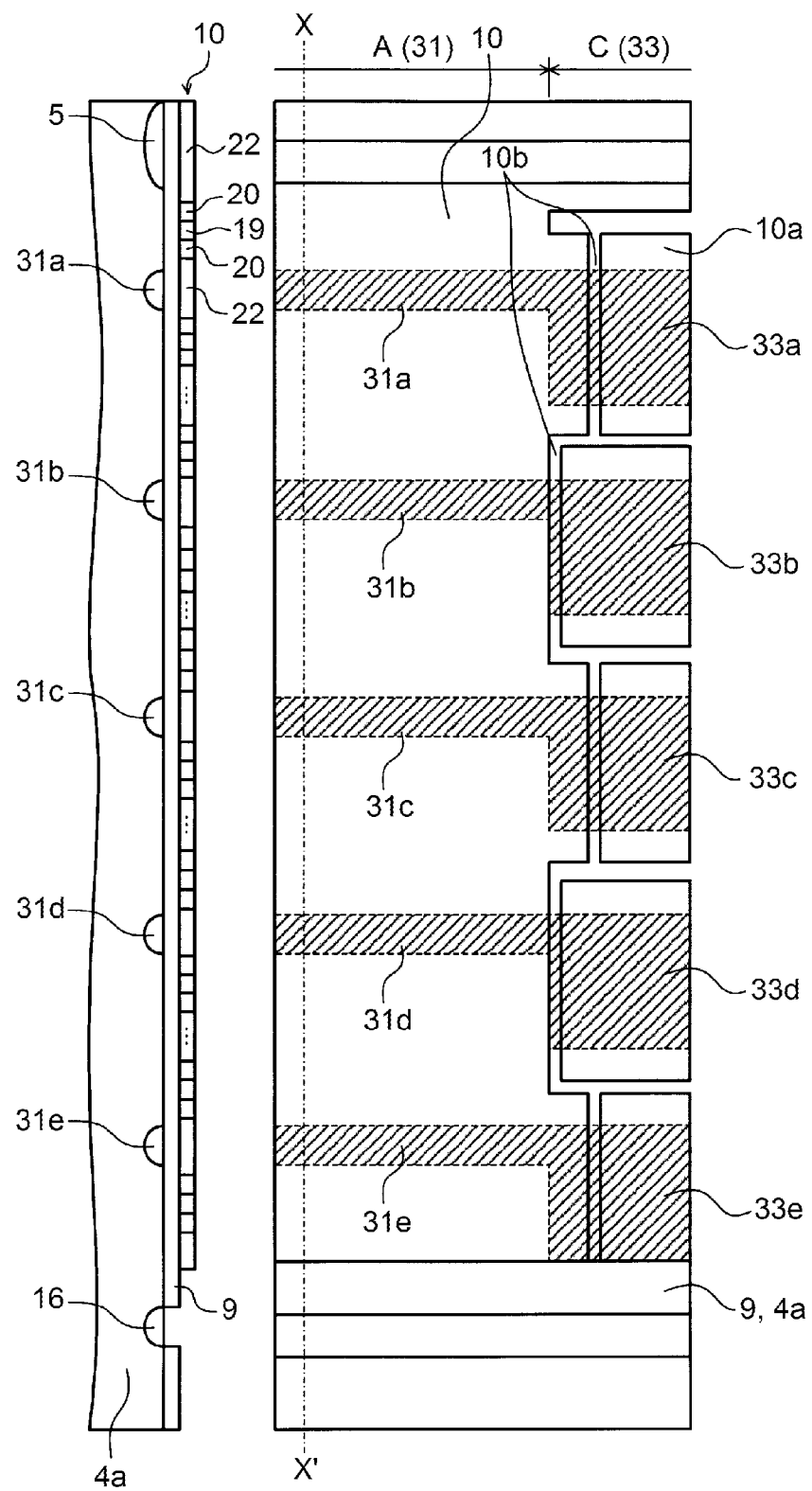
FIG. 2C is an enlarged view illustrating another example of the dashed frame portion illustrated in FIG. 2A.
Figure 2D:
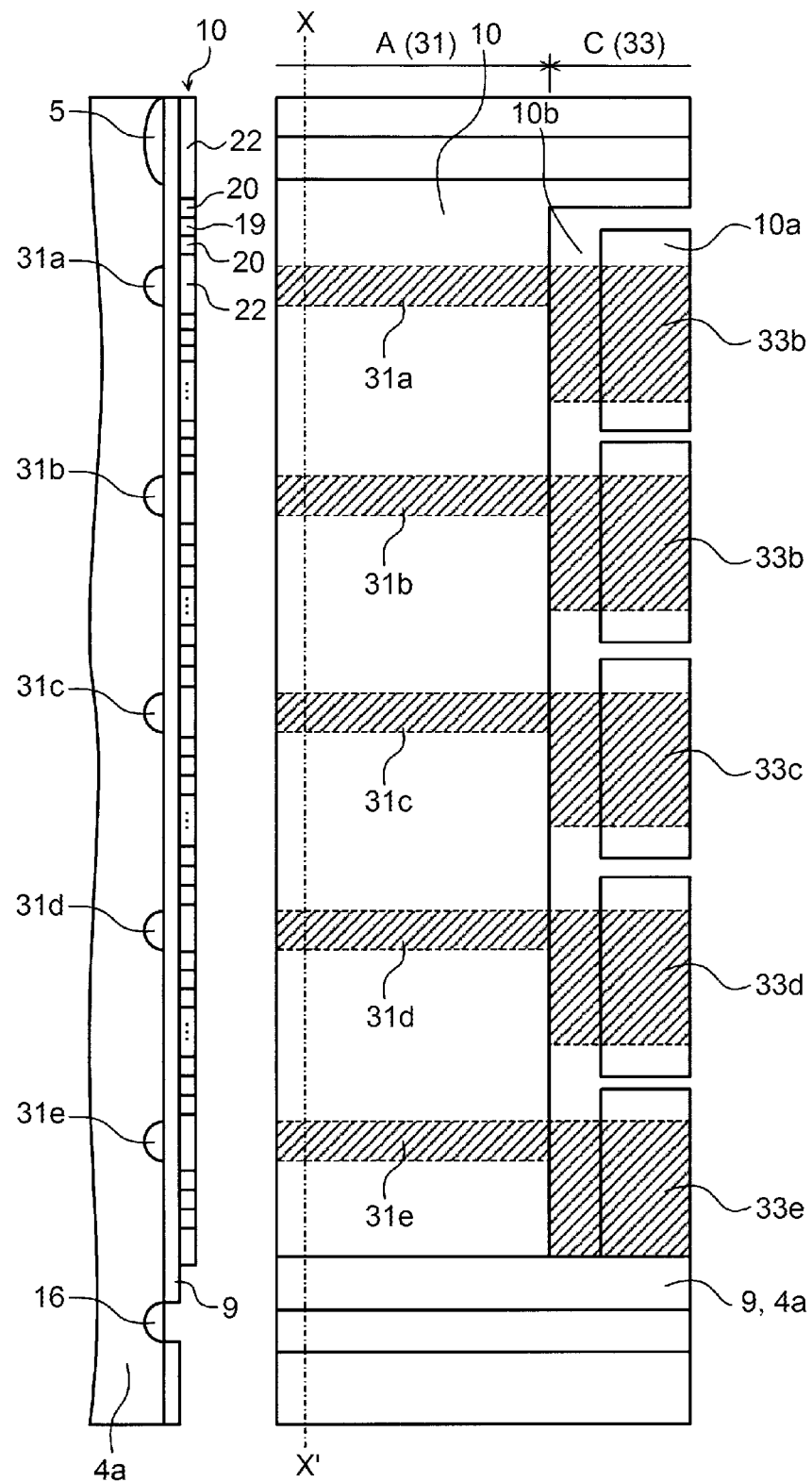
FIG. 2D is an enlarged view illustrating still another example of the dashed frame portion illustrated in FIG. 2A.

Another example of the structure of the protective diode 10 and the polysilicon field plate 10a is illustrated in FIGS. 2C and 2D. FIGS. 2C and 2D are enlarged views illustrating another example of the dashed frame portion illustrated in FIG. 2A. The structure illustrated in FIG. 2C differs from the structure illustrated in FIG. 2B in the following two points. The first difference is that polysilicon of the protective diode 10 is separated from the polysilicon field plate 10a on each of the guard rings 33a to 33e in the third guard ring regions 33 by a separation portion 10b. The second difference is that the polysilicon of the protective diode 10 and the polysilicon field plate 10a on each of the guard rings 33a to 33e are arranged in a comb shape. According to this structure, the potential of the protective diode 10 is independent of the potential of the polysilicon field plate 10a on the guard rings 33a to 33e and is less likely to be affected by the potential of the polysilicon field plate 10a. The separation portion 10b between the polysilicon of the protective diode 10 and the polysilicon field plate 10a is a little affected by the external charge. When a distance (hereinafter, referred to as a separation distance) between the polysilicon of the protective diode 10 and the polysilicon field plate 10a is sufficiently short (for example, 10 µm or less) in the separation portion 10b, the breakdown voltage is not changed even though the density of the external charge is greater than $\pm 1 \times 10^{12} \times q$ (C/cm2) (q is an elementary charge).

The structure illustrated in FIG. 2D differs from the structure illustrated in FIG. 2C in that the separation portion 10b between the polysilicon of the protective diode 10 and the polysilicon field plate 10a is arranged in a straight line from the inner circumference to the outer circumference of the chip. In the structure illustrated in FIG. 2C, potential is less likely to be changed since the polysilicon of the protective diode 10 and the polysilicon field plate 10a are arranged in a comb shape and the separation portion 10b does not extend in a straight line. In contrast, in the structure illustrated in FIG. 2D, potential is likely to be linearly changed. When the separation distance of the separation portion 10b between the polysilicon of the protective diode 10 and the polysilicon field plate 10a is equal to or less than 10 µm, preferably, equal to or less than 2 µm, the separation portion 10b is less likely to be affected by the external charge and it is easy to design a planar layout.

Figure 6:
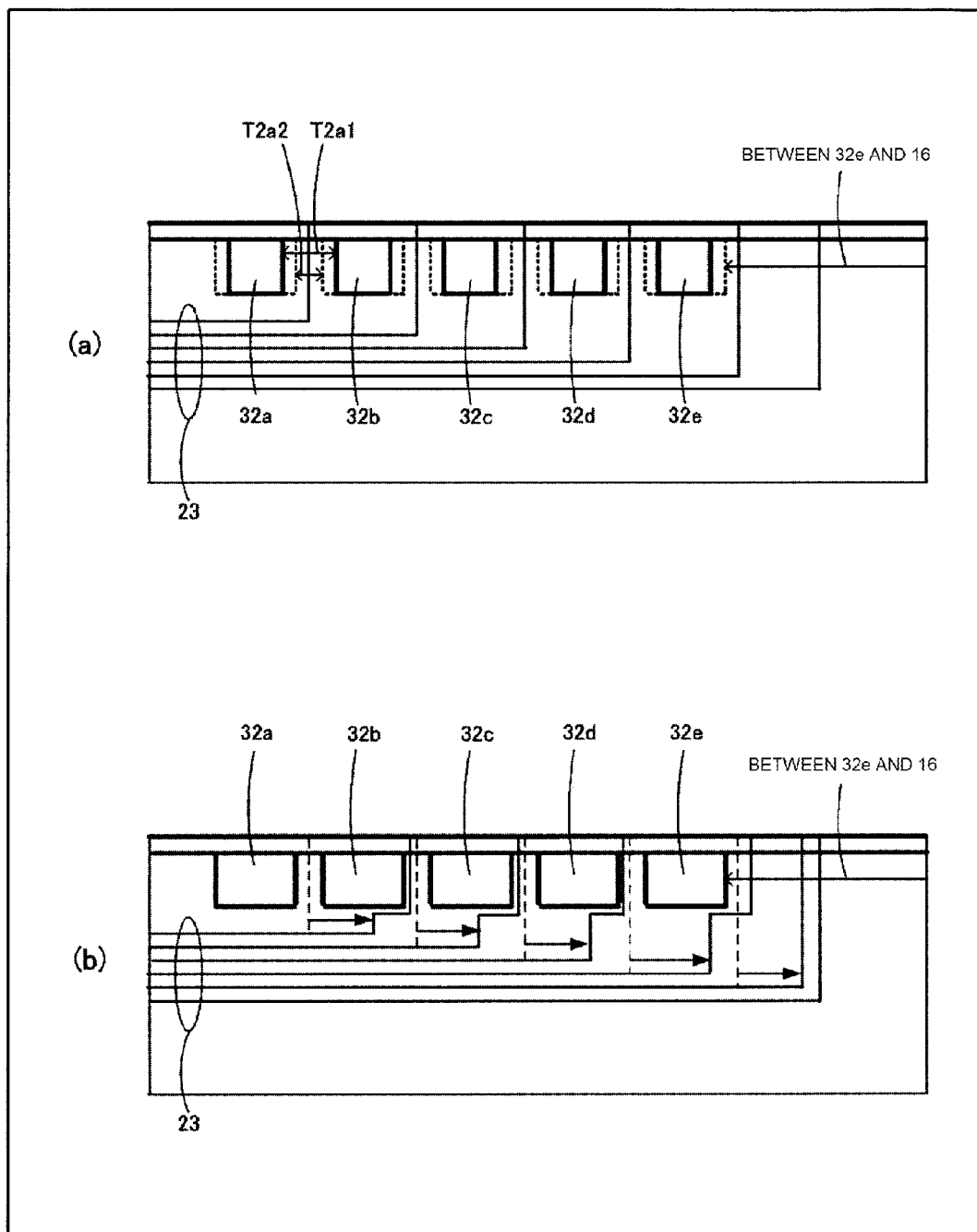
FIG. 6 is a diagram illustrating an aspect in which a gap between adjacent guard rings is reduced by side etching which occurs in a resist mask.

In the structure illustrated in FIG. 2D, at the boundary between the section A and the section C, polysilicon in the section A and polysilicon in the section C are uniformly cut from the active region 21 to the n-type stopper region 16 to form the separation portion 10b between the polysilicon of the protective diode 10 and the polysilicon field plate 10a. In this case, since the first guard ring region 31 in the section A is connected to the third guard ring region 33 in the section C, the electric field during the application of a reverse bias in the semiconductor device using the resistive field plate according to the related art illustrated in FIG. 6 is reduced and surge resistance is improved. On the other hand, at the boundary between the section A and the section C, a region without polysilicon (the separation portion 10b) is uniformly present from the active region 21 to the n-type stopper region 16, which results in a reduction in charge resistance. Therefore, it is preferable to reduce a polysilicon region when the separation portion 10b between the polysilicon of the protective diode 10 and the polysilicon field plate 10a is formed.

For example, as in the structure illustrated in FIG. 2C, at the boundary between the section A and the section C, polysilicon (the polysilicon of the protective diode 10) in the section A and polysilicon (polysilicon field plate 10a) in the section C are formed in a comb shape to reduce the region without polysilicon (the separation portion 10b between the polysilicon of the protective diode 10 and the polysilicon field plate 10a). In the structure illustrated in FIG. 2C, the separation portion 10b between the polysilicon of the protective diode 10 and the polysilicon field plate 10a is half of that in the structure illustrated in FIG. 2D.

Next, the width of the guard rings, the gap between adjacent guard rings, and the relationship among the guard rings in the sections A, B, and C will be described. In the following description, the widths of the guard rings in the first guard ring regions 31 (hereinafter, referred to as the width of the first guard ring region 31) are generically represented by W1 and the widths of the guard rings 31a to 31e are represented by W1a, W1b, W1c, W1d, and W1e, respectively. The gap between adjacent guard rings in the first guard ring regions 31 (hereinafter, referred to as the gap between the first guard ring regions 31) are generically represented by T1 and the gap between adjacent guard rings from the inside to the outside of the chip are represented by T1a, T1b, T1c, and T1d, respectively.

In the second and third guard ring regions 32 and 33, similarly to the first guard ring regions 31, the widths of the guard rings (hereinafter, referred to as the widths of the second and third guard ring regions 32 and 33) are represented by W2 and W3, respectively, and the gaps between adjacent guard rings (hereinafter, referred to as the gap between the second guard ring regions 32 and the gap between the third guard ring regions 33) are generically represented by T2 and T3, respectively. The widths of the guard rings 32a to 32e in the second guard ring regions 32 are represented by W2a, W2b, W2c, W2d, and W2e, respectively. The widths of the guard rings 33a to 33e in the third guard ring regions 33 are represented by W3a, W3b, W3c, W3d, and W3e, respectively. The gaps between adjacent guard rings in the second guard ring regions 32 from the inside to the outside of the chip are represented by T2a, T2b, T2c, and T2d. The gaps between adjacent guard rings in the third guard ring regions 33 from the inside to the outside of the chip are represented by T3a, T3b, T3c, and T3d.

The width W1 (W1a, W1b, W1c, W1d, and W1e) of the first guard ring region 31 is greater than the width W2 (W2a, W2b, W2c, W2d, and W2e) of the second guard ring region 32. The gap T1 (T1a, T1b, T1c, and T1d) between the first guard ring regions 31 is greater than the gap T2 (T2a, T2b, T2c, and T2d) between the second guard ring regions 32. That is, each guard ring is arranged in the sections A and B such that W1a>W2a, W1b>W2b, W1c>W2c, W1d>W2d, and W1e>W2e are satisfied and T1a>T2a, T1b>T2b, T1c>T2c, and T1d>T2d are satisfied.

The reason why the first and second guard ring regions 31 and 32 are arranged in this way is as follows. A distance L between a high-potential-side end portion (cathode side) and a low-potential-side end portion (anode side) of the protective diode 10, that is, the width of a portion in which five first guard ring regions 31 are formed is greater than the width P of a portion in which five second guard ring regions 32 are formed. The above-mentioned structure is used to effectively arrange the five first guard ring regions 31 in the range of the distance L between the high-potential-side end portion and the low-potential-side end portion of the protective diode 10.

The widths W1 and W2 of the first and second guard ring regions 31 and 32 are reduced toward the n-type stopper region 16 (the region in which a collector potential is reflected). The gap T1 between the first guard ring regions 31 and the gap T2 between the second guard ring regions 32 increase toward the n-type stopper region 16. That is, the guard rings 31a to 31e in the first guard ring regions 31 are arranged in the section A such that W1a>W1b>W1c>W1d>W1e and T1a<T1b<T1c<T1d are satisfied. The guard rings 32a to 32e in the second guard ring regions 32 are arranged in the section B such that W2a>W2b>W2c>W2d>W2e and T2a<T2b<T2c<T2d are satisfied.

The gap T3 (T3a, T3b, T3c, and T3d) between the third guard ring regions 33 is basically equal to the gap T2 (T2a, T2b, T2c, and T2d) between the second guard ring regions 32. The width W3 (W3a, W3b, W3c, W3d, and W3e) of the third guard ring region 33 is basically equal to the width W2 (W2a, W2b, W2c, W2d, and W2e) of the second guard ring region 32.

The third guard ring region 33 includes a portion which has a width greater than the width W1 (W1a, W1b, W1c, W1d, and W1e) of the first guard ring region 31 due to a rectangular region (which will be described below) that protrudes toward the outer circumference of the chip in a portion connected to the first guard ring region 31. The protective diode 10 is provided above the five first guard ring regions 31, with the field oxide film 9 interposed therebetween, so as to protrude from an outermost guard ring 31e (also called an outermost diffusion layer). That is, the length L of the protective diode 10 in a direction from the active region 21 to the outer circumference of the chip is a length from a portion which is closer to the inner circumference of the chip than the p-type base region end portion 5a to a portion which is closer to the outer circumference of the chip than the outer circumferential end of the outermost guard ring 32e in the second guard ring region 32. Therefore, the protective diode 10 provided with the plurality of series pn zener diodes 18 has the effect of linearly increasing potential according to the distance in the outer circumference direction. When the protective diode 10 is formed so as to protrude from the guard ring to the outside, equipotential lines can be drawn to the outside of the guard ring. Therefore, it is possible to further reduce the electric field intensity of the guard ring.

Next, the relationship between the occupation area of the first to third guard ring regions 31 to 33 and the potential distribution of the depletion layer will be described. The surface area (occupation area) of each guard ring in the second guard ring region 32 with respect to the surface area of the termination structure region 100a in a portion in which the five second guard ring regions 32 are formed is greater than the surface area of each guard ring in the first guard ring region 31 with respect to the surface area of the termination structure region 100a a portion in which the five first guard ring regions 31 are formed. Therefore, the potential of each second guard ring region 32 is dominant over the potential of the first guard ring region 31 and the third guard ring region 33 and the potential of each of the guard rings 31a to 31e in the first guard ring regions 31 is substantially fixed to the potential of each of the guard rings 32a to 32e in the second guard ring regions 32 which are connected to the first guard ring regions 31. When the potential of the outermost guard ring 32e in the second guard ring region 32 is reduced, the potential of the outermost guard ring 31e in the first guard ring region 31 which is connected to the guard ring 32e is also reduced.

A rectangular region which protrudes from the curved region of the third guard ring region 33 to the outer circumference of the chip such that the area thereof increases is provided at the end of the third guard ring region 33 in the section C which is connected to the first guard ring region 31 in the section A. When a potential distribution is curved from the section B to the section A through the section C, the rectangular region with the large area in the third guard ring region 33 has the effect of fixing potential, suppressing a variation in the potential of the guard ring, and stabilizing the potential.

Figure 11:
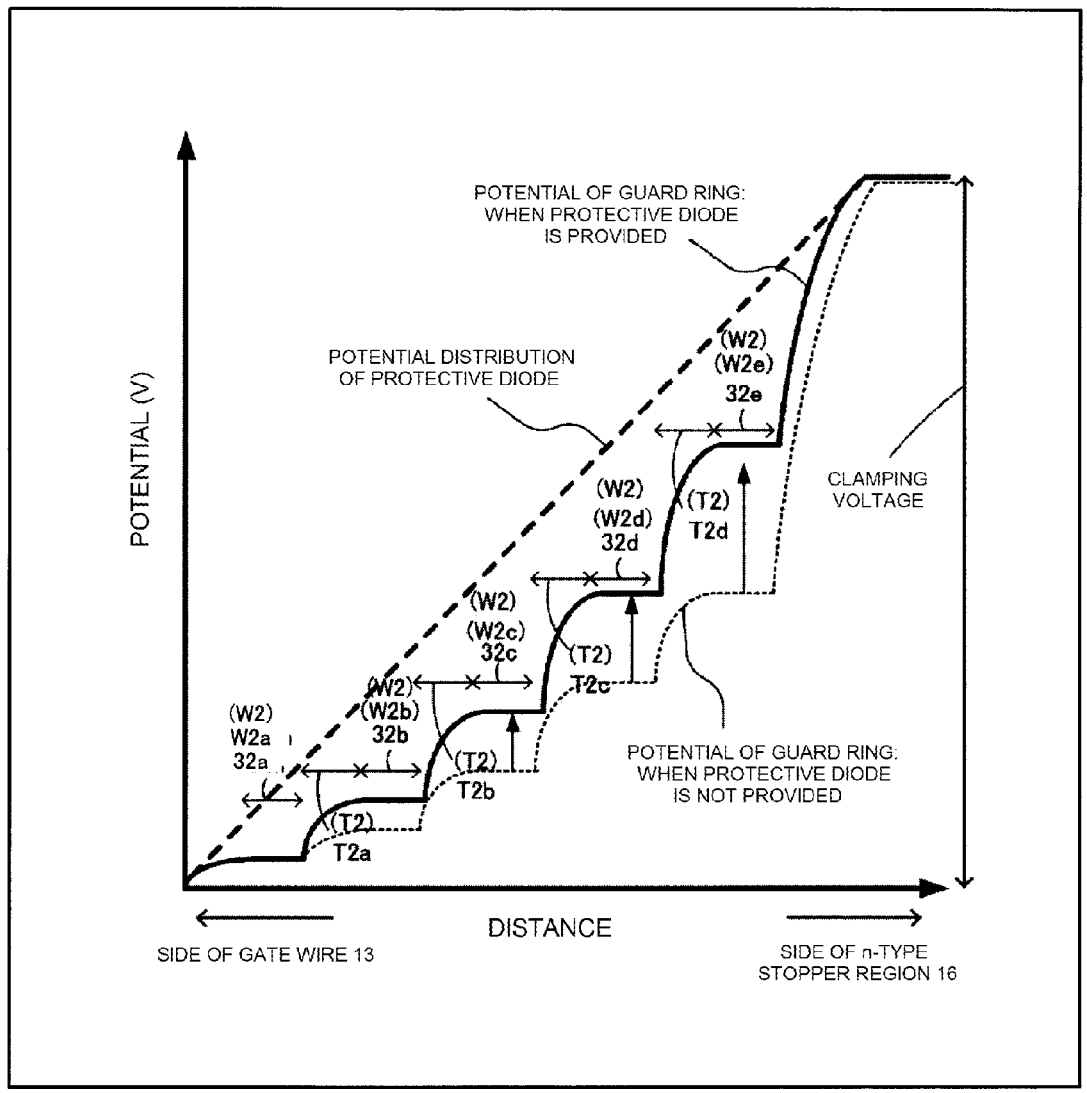
FIG. 11 is a characteristic diagram illustrating a potential distribution from a second guard ring region 32 and a gate wire 13 of a protective diode 10 to an n-type stopper region 16.

Next, the potential distributions of the second guard ring region 32 and the protective diode 10 will be described. FIG. 11 is a characteristic diagram illustrating the potential distributions of the second guard ring region 32 and the protective diode 10 in a direction from the gate wire 13 to the n-type stopper region 16. The potential distribution of the second guard ring region 32 illustrated in FIG. 11 is the potential distribution of the guard rings 32a to 32e in the second guard ring regions 32 in the vicinity of a pn junction depth. In FIG. 11, a dotted line indicates the potential distribution of the protective diode 10. A dotted line which is thinner than that indicating the potential distribution of the protective diode 10 indicates a potential distribution when the protective diode 10 is not provided. A solid line indicates a potential distribution when the protective diode 10 is provided.

The plurality of series pn zener diodes 18 forming the protective diode 10 function as a pseudo resistive field plate (a field plate which is a resistive film with a higher resistance than metal). Since the series pn zener diodes 18 function as the resistive field plate, the potential distribution of the protective diode 10 from the gate wire 13 to the stopper electrode 11 linearly increases with respect to the distance from the gate wire 13. Therefore, as illustrated in FIG. 11, the equipotential lines are linearly and uniformly distributed in the surface of the protective diode 10. Therefore, the protective diode 10 provides assistance such that the potential distribution formed by the first guard ring region 31 is approximately uniform. Therefore, even when the width W1 of the first guard ring regions 31 and the gap T1 between the first guard ring regions 31 are greater than the width W2 of the second guard ring regions 32 and the gap T2 between the second guard ring regions 32, the potential distribution is uniformized and the depletion layer is sufficiently spread. Therefore, the concentration of the electric field is reduced. Here, the breakdown voltage of the protective diode 10 is, for example, 400 V.

The breakdown voltage of the protective diode 10 may be set to be lower than the breakdown voltage of the IGBT 40 to prevent the occurrence of avalanche breakdown in the IGBT 40. In this case, in the protective diode 10 with a lower breakdown voltage than the IGBT 40, it is possible to reduce the distance (length) L between the high-potential-side end portion and the low-potential-side end portion of the protective diode 10. Therefore, in some cases, the widths W1 to W3 of the first guard ring regions 31 to 33 are equal to each other and the gaps T1 to T3 between the first guard ring regions 31 to 33 are equal to each other. In addition, the width W2 (W2a, W2b, W2c, W2d, and W2e) of the second guard ring regions 32 and the gap T2 (T2a, T2b, T2c, and T2d) between the second guard ring regions 32 are designed to the minimum width and gap capable of ensuring the breakdown voltage of the IGBT 40. That is, the IGBT 40 is designed such that the width (the width P of the portion in which the five second guard ring regions 32 are formed) of the termination structure region 100a is the minimum. In this case, while the breakdown voltage of the IGBT 40 is 600 V, the breakdown voltage of the protective diode 10 is 400 V.

Example 1

Figure 3:
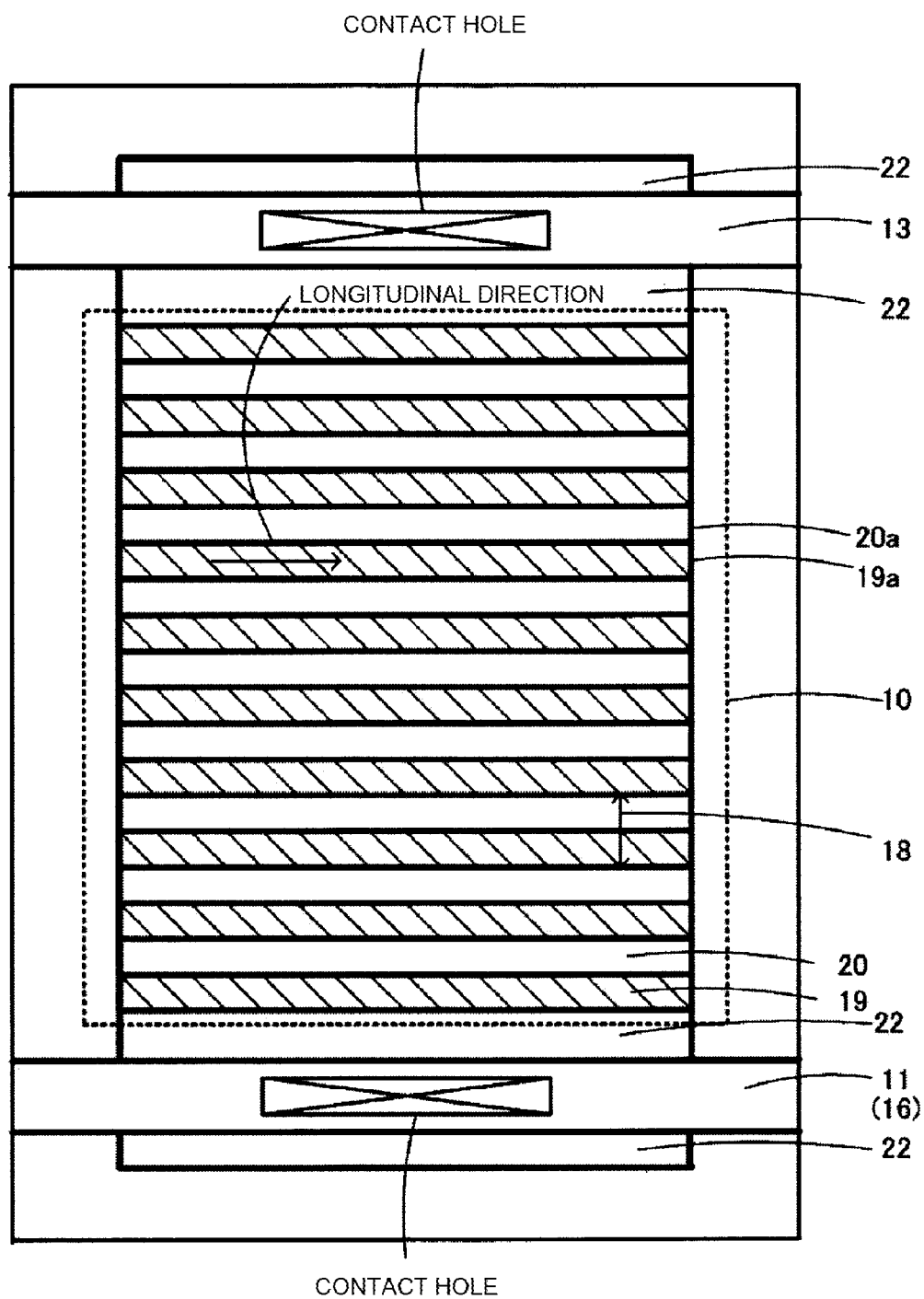
FIG. 3 is a plan view illustrating the structure of a main portion of a protective diode 10 illustrated in FIG. 1.

Next, the protective diode 10 will be described. FIG. 3 is a plan view illustrating the structure of a main portion of the protective diode 10 illustrated in FIG. 1. In the protective diode 10, the p+ layers 19 and the n− layers 20 having a substantially rectangular shape that is elongated in a direction (hereinafter, referred to as a longitudinal direction) perpendicular to the direction in which the p+ layers 19 and the n− layers 20 are alternately arranged are arranged in parallel to the stopper electrode 11 (n-type stopper region 16) that is elongated in the longitudinal direction. Therefore, it is possible to prevent the ends 19a and 20a of the p+ layer 19 and the n− layer 20 in the longitudinal direction from being arranged close to the stopper electrode 11 with a collector potential. As a result, the concentration of the electric field is reduced at the ends 19a and 20a (the ends close to the protective diode 10) of the p+ layer 19 and the n− layer 20 in the longitudinal direction.

The p+ layer 19 is a high-concentration p-type layer (p+) and the n− layer 20 is a low-concentration n-type layer (n−). The p+ layer 19 and the n− layer 20 are made of polysilicon doped with impurities. For the impurity concentration of the p+ layer 19, impurity concentration which is integrated in the thickness direction of the polysilicon layer is, for example, equal to or greater than about $1 \times 10^{15}/cm^2$ and equal to or less than about $5 \times 10^{15}/cm^2$, specifically, for example, $2 \times 10^{15}/cm^2$. For example, when the thickness of the polysilicon layer is 1 μm, the average impurity concentration of the p+ layer 19 is $2 \times 10^{19}/cm^3$. For the impurity concentration of the n− layer 20, impurity concentration which is integrated in the thickness direction of the polysilicon layer is, for example, equal to or greater than about $1 \times 10^{14}/cm^2$ and equal to or less than about $5 \times 10^{14}/cm^2$, specifically, for example, $4 \times 10^{14}/cm^2$. For example, when the thickness of the polysilicon layer is 1 μm, the average impurity concentration of the n− layer 20 is $4 \times 10^{18}/cm^3$. That is, the impurity concentration of the n− layer 20 may be about a tenth of the impurity concentration of the p+ layer 19 (for example, equal to or greater than a fiftieth of the impurity concentration of the p+ layer 19 and equal to or less than a fifth of the impurity concentration of the p+ layer 19).

In addition, the n− layer 20 may have a structure in which the low-concentration n-type layer (n−) and the high-concentration n-type layer (n+) are connected in series to each other, in order to maintain a high voltage. In this case, the protective diode 10 is not a zener diode, but is a simple pn diode. The high-concentration n+ layers 22 which are provided at both ends of the protective diode 10 are high-concentration n-type layers (n+) for ohmic contact with the gate wire 13 or the stopper electrode 11.

The protective diode 10 includes, for example, about 50 to 70 series pn zener diodes 18. The breakdown voltage of each series pn zener diode 18 is, for example, equal to or greater than about 6 V and equal to or less than about 8 V. The breakdown voltage of the protective diode 10 is, for example, equal to or greater than about 300 V and equal to or less than about 560 V. The protective diode 10 is arranged above the five first guard ring regions 31 so as to overlap the five first guard ring regions 31 and functions as a field plate. Therefore, the concentration of the electric field of the outermost guard ring 31e in the first guard ring region 31 is reduced and the occurrence of avalanche breakdown at the position is prevented. As a result, breakdown due to a surge voltage is prevented and it is possible to improve the reliability of the semiconductor device 100.

As illustrated in FIG. 1(b), since the polyimide film 15 is used as the surface protective film, the occurrence of cracks due to, for example, a temperature cycle test is prevented. In addition, corrosion does not occur due to the temperature-humidity-bias (THB) test and a variation in characteristics due to corrosion does not occur. Therefore, high reliability is obtained.

In the section C illustrated in FIG. 2A, an inner circumferential end 13a of the gate wire 13 or an inner circumferential end 28a of the polysilicon film forming the protective diode 10 may be arranged so as to be convex toward the inside of the chip in a rectangular shape. However, as described above, the p-type base region end portion 5a is curved, similarly to the third guard ring region 33, and the depletion layer is spread to reflect the shape of the third guard ring region 33. In addition, the gate wire 13 is arranged in the p-type base region 5 so as to protrude from the p-type base region end portion 5a to the outer circumference of the chip (that is, onto the n− region 4a).

Example 2

Figure 4:
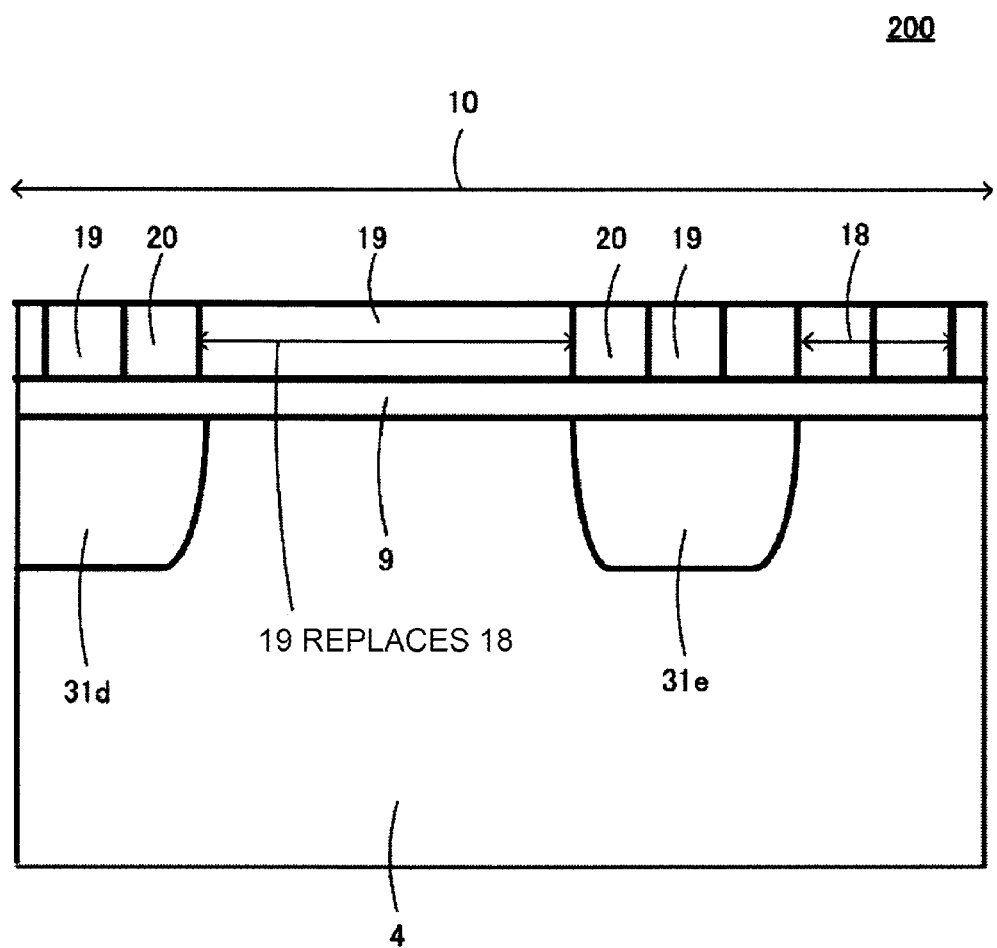
FIG. 4 is a cross-sectional view illustrating the structure of a main portion of a semiconductor device 200 according to a second example of the invention.

Next, another example of the semiconductor device according to Embodiment 1 will be described. FIG. 4 is a cross-sectional view illustrating the structure of a main portion of a semiconductor device 200 according to a second example of the invention. FIG. 4 illustrates the vicinity of an outermost guard ring 31e in a first guard ring region 31 and an adjacent guard ring 31d which is provided inside the outermost guard ring 31e. The semiconductor device 200 according to the second example illustrated in FIG. 4 differs from the semiconductor device 100 according to the first example illustrated in FIG. 1 in that one p+ layer 19 (or one n− layer 20) replaces the series pn zener diode 18 which is provided immediately above the space between the outermost guard ring 31e in the first guard ring region 31 and the adjacent guard ring 31d provided inside the outermost guard ring 31e (on the field oxide film 9 which is provided on the surface of a portion of the n− region 4a interposed between the guard rings 31d and 31 e) among a plurality of series pn zener diodes 18 forming the protective diode 10.

When the number of series pn zener diodes 18 forming the protective diode 10 is reduced to, for example, six (about six p+ layers 19 and six n− layers 20 which are adjacent to each other), the potential of the protective diode 10 immediately above the outermost guard ring 31e in the first guard ring region 31 in the design phase is about 40 V (7 V×6=42 V: when a zener voltage (breakdown voltage) is about 7 V) less than that when the number of series pn zener diodes 18 is not reduced. That is, one p+ layer 19 (or one n− layer 20) replaces the series pn zener diode 18 which is provided immediately above the space between the outermost guard ring 31e in the first guard ring region 31 and the adjacent guard ring 31d provided inside the outermost guard ring 31e to reduce the potential of the protective diode 10 immediately above the guard ring 31e by, for example, about 40 V from the potential of the outermost guard ring 31e in the first guard ring region 31 in the design phase.

The reason is as follows. An increase in potential between the outermost guard ring 31e in the first guard ring region 31 and the n-type stopper region 16, which is caused by side etching in an ion implantation mask (a resist mask or an oxide film mask) is offset by a reduction in the potential of the protective diode 10 provided immediately above the guard ring 31e which is set in advance. That is, during the patterning of the ion implantation mask for forming the guard rings, when the end of the ion implantation mask is recessed from the end of the guard ring pattern formed in a photomask and the width of the guard ring is increased by the amount of recess (removal) D of the ion implantation mask, the gap between adjacent guard rings is reduced by the amount of recess D (=2D) of the ion implantation mask. As a result, the potential balance between the first guard ring region 31 and the second guard ring region 32 deteriorates. Therefore, as described above, the potential of the protective diode 10 provided immediately above the guard ring 31e is reduced in advance to prevent the potential balance from deteriorating. The phenomenon in which the potential balance between the first guard ring region 31 and the second guard ring region 32 deteriorates will be described below.

When the p-type guard ring region 6 (that is, the first to third guard ring regions 31 to 33) is formed, side etching occurs in a resist mask (ion implantation mask) due to etching using photolithography (when an oxide film mask is used as the ion implantation mask, side etching due to the overetching of the oxide film mask is added). When side etching occurs in the resist mask, the gap between the p-type guard ring regions 6 which are formed using the resist mask (that is, the gap T1 between the first guard ring regions 31, the gap T2 between the second guard ring regions 32, and the gap T3 between the third guard ring regions 33) is less than a design value (when no side etching occurs). As described above, the gap T2 between the second guard ring regions 32 is less than the gap T1 between the first guard ring regions 31. Therefore, when the gap between the guard ring regions is reduced by side etching which occurs in the resist mask, the gap T2 between the second guard ring regions 32 in the section B is greater than the gap T1 between the first guard ring regions 31 in the section A.

FIG. 6 is a diagram illustrating an aspect in which the gap between adjacent guard rings is reduced by side etching that occurs in the resist mask. FIG. 6(a) illustrates a case in which side etching does not occur in the resist mask and opening portions (ion implantation windows) corresponding to regions in which the guard rings 32a to 32e are formed are formed at the same positions on the photomask as guard ring patterns. FIG. 6(b) illustrates a case in which side etching occurs in the resist mask. Equipotential lines 23 are illustrated in FIGS. 6(a) and 6(b).

In FIG. 6(a), when side etching occurs in the resist mask, a design gap T2a1 between the second guard ring regions 32 is less than a gap T2a2 due to the side etching which occurs in the resist mask and is as illustrated in FIG. 6(b) (the gaps between other guard ring regions are also narrow). In this state, when a positive clamping voltage is applied to the stopper electrode 11 and a negative clamping voltage is applied to the gate wire 13 by the protective diode 10, the number of equipotential lines 23 that pass between the guard rings having the gap T2a2 therebetween, which is less than the design gap T2a1, is smaller than that when the gap between the guard rings is the design gap T2a1. Here, the "passage of the equipotential lines 23" means that the equipotential lines 23 are drawn to a portion with a sufficient amount of electricity to generate one or more equipotential lines 23 and a "portion through which the equipotential line 23 is not capable of passing" means a portion which does not have a sufficient of electricity to generate the equipotential line 23. As illustrated in FIG. 6(b), the equipotential line 23 which is not capable of passing between the guard rings is sequentially pressed to a space between the guard rings which are disposed on the outer circumferential side of the chip between the guard rings. Finally, the equipotential line 23 passes between the outermost guard ring 32e of the second guard ring region 32 and the n-type stopper region 16 (in FIG. 6, "between 32e and 16"). Therefore, a reduction in the equipotential lines 23 between the guard rings is distributed so as to be added between the outermost guard ring 32e of the second guard ring region 32 and the n-type stopper region 16 and the density of the equipotential lines 23 between the outermost guard ring 32e of the second guard ring region 32 and the n-type stopper region 16 increases. As a result, potential at the width W2e of the outermost guard ring 32e in the second guard ring region 32 is reduced and the reduction in the potential is added to the potential between the outermost guard ring 32e of the second guard ring region 32 and the n-type stopper region 16. Potential increases in the region interposed between the guard ring 32e and the n-type stopper region 16.

Figure 5:
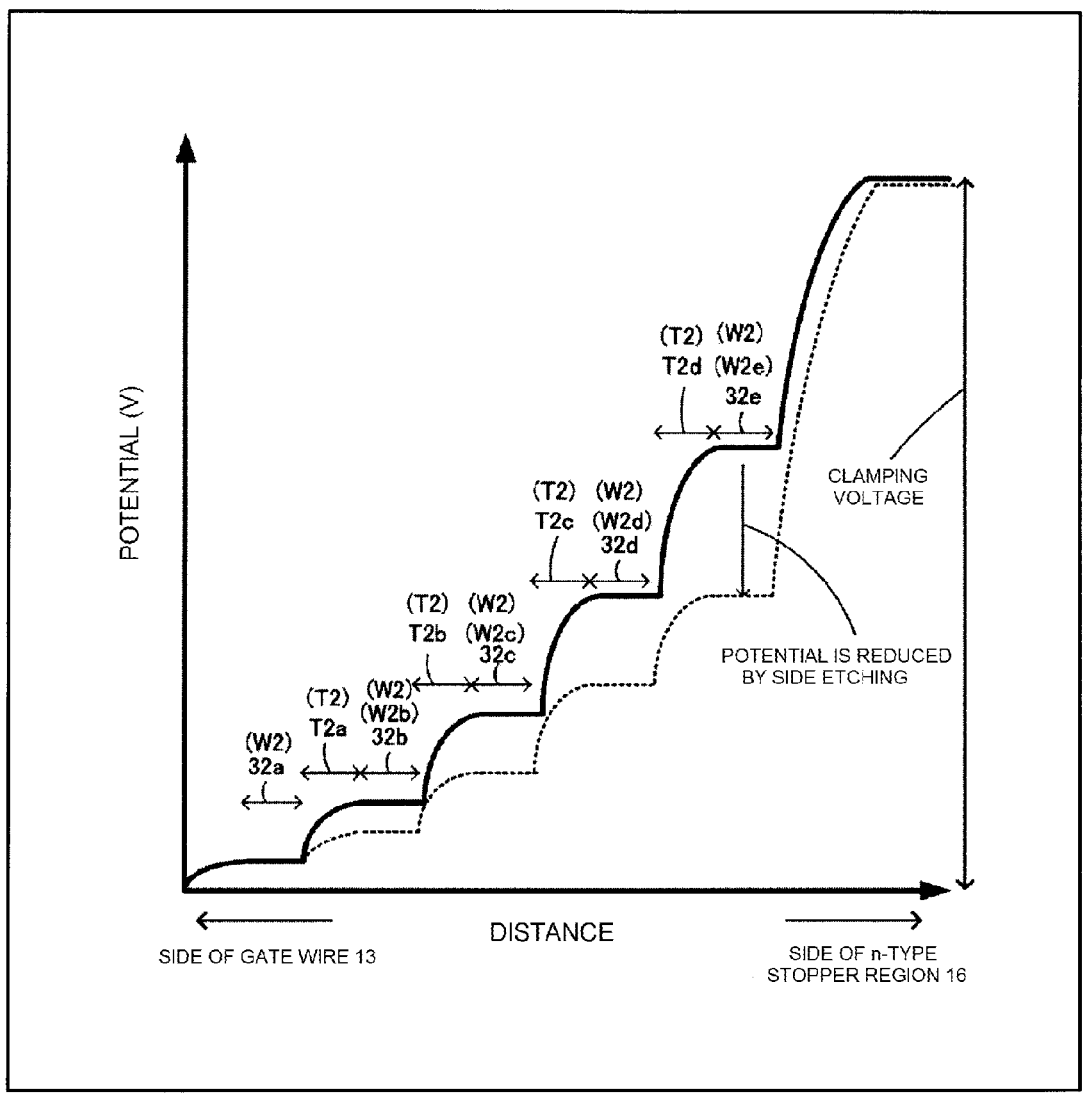
FIG. 5 is a characteristic diagram illustrating the potential distribution of a second guard ring region 32 which increases from a gate wire 13 to an n-type stopper region 16 in stages.

FIG. 5 is a characteristic diagram illustrating the potential distribution of the second guard ring region 32 in which potential increases in stages from the gate wire 13 to the n-type stopper region 16. The percentage of the gap between adjacent guard rings being reduced due to side etching which occurs in the ion implantation mask with respect to the gap between adjacent guard rings when side etching does not occur in the ion implantation mask is different in the guard rings. For example, the percentage of the gap between adjacent guard rings being reduced due to side etching which occurs in the ion implantation mask is the highest between the innermost guard ring 32a and the adjacent guard ring 32b that is disposed outside the innermost guard ring 32a, which have the smallest gap T2a therebetween, among the plurality of guard rings. Therefore, when the equipotential line 23 shifts to the outer circumference of the chip as illustrated in FIG. 6, the potential difference between the guard rings is small (in the gap T2a) between the innermost guard ring 32a and the adjacent guard ring 32b that is disposed outside the innermost guard ring 32a and is the largest (in the gap T2d) between the outermost guard ring 32e and the adjacent guard ring 32d that is disposed inside the outermost guard ring 32e. As a result, as illustrated in FIG. 5, the entire potential distribution curve of the second guard ring region 32 shifts from the n-type stopper region 16 to the gate wire 13 so as to be convex in a direction in which the potential between the guard rings is reduced, while maintaining the clamping voltage.

A change in the potential distribution of the outermost guard ring 32e in the second guard ring region 32 is transmitted to the outermost guard ring 31e in the first guard ring region 31 through the outermost guard ring 33e in the third guard ring region 33. Then, the potential of the outermost guard ring 31e in the first guard ring region 31 is reduced. Therefore, the potential of the first guard ring region 31 is also reduced. The reduction in the potential is the largest between the outermost guard ring 31e in the first guard ring region 31 and the outermost guard ring 32e in the second guard ring region 32.

In the first guard ring region 31, the gap between adjacent guard rings is several times greater than that in the second guard ring region 32. That is, in the first guard ring region 31, the percentage of the gap T1 between the first guard ring regions 31 being reduced due to side etching with respect to the design gap T1 between the first guard ring regions 31 is lower than the percentage of the gap T2 between the second guard ring regions 32 being reduced due to side etching. In addition, the potential is further reduced in the gap T1 between the first guard ring regions 31 by the influence of the potential distribution of the protective diode 10 which is provided above the first guard ring region 31. Therefore, the potential between the guard rings (in the gap T1 (T1a to T1d)) in the first guard ring regions 31 is higher than the potential between the guard rings (in the gap T2 (T2a to T2d)) in the second guard ring regions 32. The potential difference is the largest in the outermost guard ring 32e in the second guard ring region 32. Therefore, as the amount of side etching of the ion implantation mask increases, the potential is reduced in the outermost guard ring 32e in the second guard ring region 32. Therefore, a spatial variation in the potential distribution is offset between the first and third guard ring regions 31 and 33 and the second guard ring region 32 outside the outermost guard ring and electric field intensity increases. As a result, electric field intensity is the highest in a portion of the second guard ring region 32 close to the third guard ring region 33 and avalanche breakdown occurs.

Next, a means for preventing the occurrence of the avalanche breakdown in the outermost guard ring 32e in the second guard ring region 32 will be described. As described above, the potential of the protective diode 10 which is arranged immediately above the outermost guard ring 31e in the first guard ring region is set to a small value of, for example, about 40 V in advance. In this case, even when the potential of the outermost guard ring 31e in the first guard ring region 31 is reduced due to side etching that occurs in the ion implantation mask during a manufacturing process and is greater than an assumed value, the potential of the protective diode 10 can approximate to the potential of the outermost guard ring 31e in the first guard ring region 31. When the potentials are close to each other, a difference between the potential (in the gap T2d) between the outermost guard ring 31e in the first guard ring region 31 and the guard ring 32d which is disposed inside first guard ring region 31 and the potential of the outermost guard ring 31e in the first guard ring region 31 is reduced. As a result, it is possible to reduce the concentration of the electric field on the outermost guard ring 31e in the first guard ring region 31.

Next, a detailed means for reducing the potential of the protective diode 10 provided immediately above the outermost guard ring 31e in the first guard ring region 31 to, for example, about 40 V in advance will be described. That is, as described above, one p+ layer 19 (or one n− layer 20) replaces the series pn zener diode 18 which is provided immediately above the space between the outermost guard ring 31e in the first guard ring region 31 and the adjacent guard ring 31d that is provided inside the outermost guard ring 31e among the plurality of series pn zener diodes 18 forming the protective diode 10.

For example, when one p+ layer 19 (or one n− layer 20) replaces six series pn zener diodes 18 (about six p+ layers 19 and six n− layers 20 which are adjacent to each other), the potential of the protective diode 10 immediately above the outermost guard ring 31e in the first guard ring region 31 in the design phase is about 40 V (7 V×6=42 V: when a zener voltage is about 7 V) less than that when the series pn zener diodes 18 are provided in the portion. That is, the potential of the protective diode 10 immediately above the outermost guard ring 31e in the first guard ring region 31 is about 40 V less than the potential of the outermost guard ring 31e in the first guard ring region 31 in the design phase.

As described above, since only one p+ layer 19 (or only one n− layer 20) is provided in a portion of the protective diode 10 in which the series pn zener diode 18 is not provided, no pn junction is formed between the guard rings. Therefore, a reduction in the potential between the guard rings immediately below a portion of the protective diode in which the number of series pn zener diodes 18 is reduced is added to an increase in the potential of the protective diode 10 immediately above the outermost guard ring 31e in the first guard ring region 31 and the n-type stopper region 16. As a result, the potential of the protective diode 10 can approximate to the potential of the outermost guard ring 31e in the first guard ring region 31 and the breakdown voltage of the protective diode 10 is not reduced.

As such, since the potential of the protective diode 10 provided immediately above the outermost guard ring 31e in the first guard ring region 31 is approximate to the potential of the guard ring 31e, the concentration of the electric field on the outermost guard ring 31e in the first guard ring region 31 is reduced and it is possible to prevent the occurrence of avalanche breakdown in the portion. As a result, even when side etching occurs in the ion implantation mask for forming the guard rings, it is possible to protect the outermost guard ring 31e in the first guard ring region 31 which is provided below the protective diode 10 from being broken due to a surge voltage.

It is preferable that the distance between the end of the guard ring pattern on the ion implantation mask and the end of the protective diode 10 be, for example, about 10 µm (for example, equal to or greater than 5 µm and equal to or less than 15 µm). In this case, even when there is a variation in the amount of ion implantation mask removed by side etching (hereinafter, referred to the amount of side etching), side etching which occurs in the ion implantation mask has little adverse effect on the breakdown voltage of the protective diode 10.

When side etching which occurs in the ion implantation mask is negligibly small, a reduction in the potential of the outermost guard ring 31e in the first guard ring region 31 is small. Therefore, a reduction in the potential of the protective diode 10 immediately above the outermost guard ring 31e in the first guard ring region 31 is suppressed in the range of, for example, 7 V to 50 V and the concentration of the electric field on the outermost guard ring 31e in the first guard ring region 31 can be reduced. As a result, avalanche breakdown does not occur. The reduction in the potential in the range of 7 V to 50 V corresponds to one to seven series pn zener diodes 18 which are replaced with one p+ layer 19 (or one n− layer 20) for reducing the potential of the protective diode 10 immediately above the guard ring 31e in advance. When the reduction in the potential is greater than 50 V, the electric field intensity between the outermost guard ring 31e in the first guard ring region 31 and the n-type stopper region 16 increases, which is not preferable.

In Examples 1 and 2, the resistive SiN film is not used, but the polyimide film 15 is used as the surface protective film, unlike the related art. Therefore, no crack occurs in the polyimide film 15 and the metal film (for example, the emitter electrode 8, the gate wire 13, and the stopper electrode 11) due to the difference between thermal expansion coefficients. As a result, it is possible to improve reliability. In addition, the number of device controlling processes is reduced during manufacture and it is possible to improve productivity.

In Example 1, the series pn zener diodes 18 are formed on the first guard ring regions 31 and on a portion interposed between the first guard ring regions 31 (a portion of the n− region 4a interposed between the first guard ring regions 31 which are adjacent with a gap T31 therebetween. However, the series pn zener diode 18 may not be formed on the first guard ring region 31. That is, the series pn zener diode 18 may be formed only on the portion (the gap T1) interposed between the guard rings. According to this structure, the potential distribution of the protective diode 10 is close to the stepwise potential distribution of the first guard ring region 31. Therefore, when the number of series pn zener diodes 18 is reduced, it is difficult to form the protective diode 10 with a high breakdown voltage, but this structure is effective in reducing the concentration of the electric field on the outermost guard ring 31e in the first guard ring region 31. When the series pn zener diode 18 is provided above the first guard ring region 31, it is difficult to obtain a breakdown voltage. Therefore, it is preferable to change the number of series pn zener diodes 18 and the position thereof depending on the design conditions.

Figure 7:
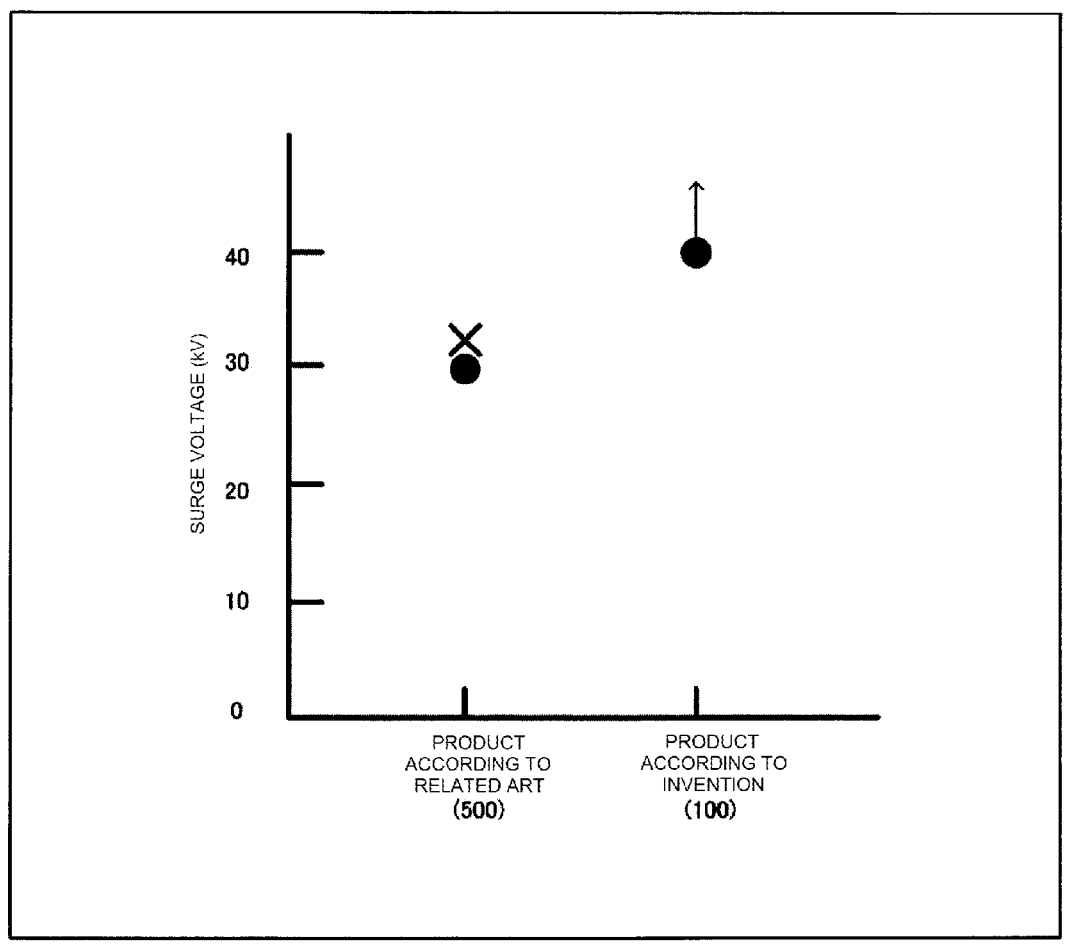
FIG. 7 is a characteristic diagram illustrating the surge resistance test result of the semiconductor device according to the invention.
Figure 10:
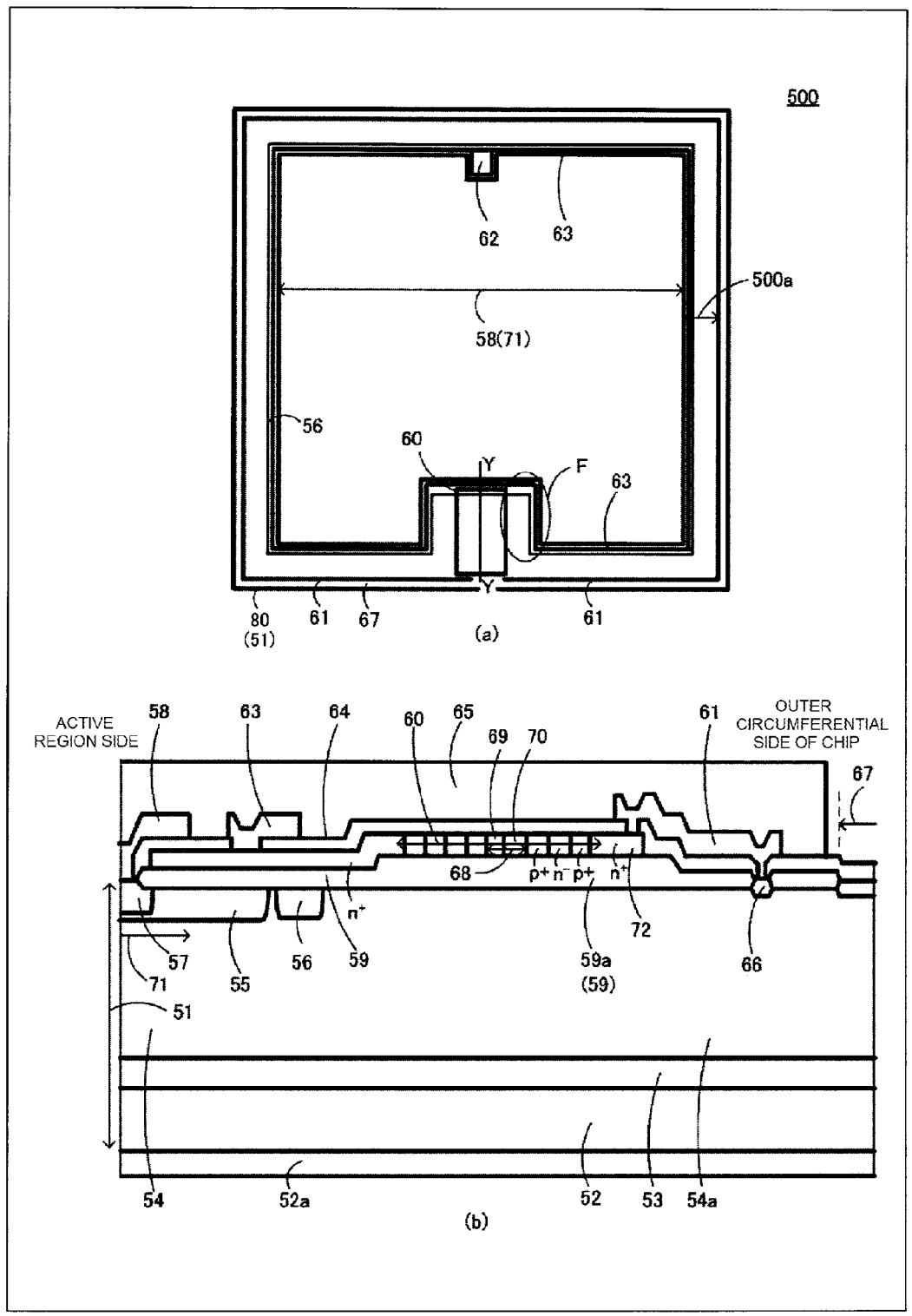
FIG. 10 is a diagram illustrating the structure of a semiconductor device 500 according to the related art.

Next, the surge resistance of the semiconductor device according to the invention will be described. FIG. 7 is a characteristic diagram illustrating the surge resistance test result of the semiconductor device according to the invention. The product according to the related art illustrated in FIG. 7 is the semiconductor device 500 according to the related art illustrated in FIG. 10. It was confirmed that the product according to the related art was broken at a surge voltage of about 33 kV greater than 30 kV. In contrast, the product according to the invention illustrated in FIG. 7 is the semiconductor device 100 according to the first example illustrated in FIG. 1. It was confirmed that the product according to the invention was not broken at a surge voltage greater than 40 kV. Although not illustrated in the drawings, in the semiconductor device 200 according to the second example illustrated in FIG. 3, the same result as that in the product according to the invention illustrated in FIG. 7 was obtained. These results prove that the surge resistance of the products according to the invention is significantly improved. The surge resistance test is performed by changing a gap J of a spark plug 507 illustrated in FIG. 9 to change the surge voltage. The surge resistance means resistance to a voltage generated by the spark plug.

Example 3

Figure 8:
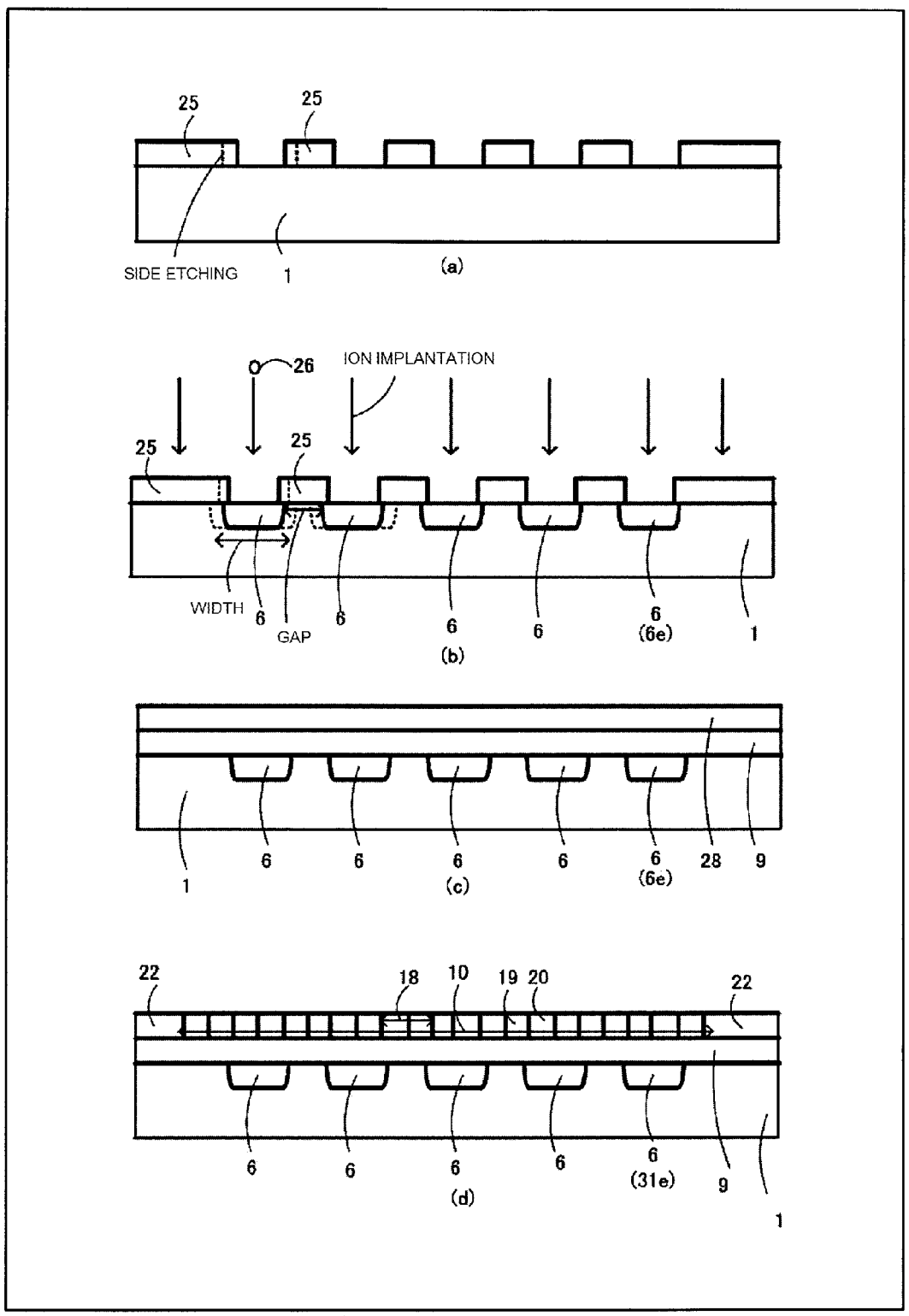
FIG. 8 is a cross-sectional view illustrating the state of a semiconductor device according to a third example which is being manufactured.

Next, a method for manufacturing (producing) the semiconductor device 100 according to the first example will be described as an example of a semiconductor device manufacturing method according to Example 3. FIG. 8 is a cross-sectional view illustrating the state of the semiconductor device 100 according to the third example of the invention which is being manufactured. FIGS. 8(a) to 8(d) are cross-sectional views illustrating the main manufacturing processes. The processes illustrated in FIGS. 8(a) to 8(d) are processes for forming the p-type guard ring regions 6 and the protective diode 10. For simplicity of description, in the schematic view illustrated in FIG. 8, the guard rings in the p-type guard ring regions 6 have the same width and the gaps between the guard rings in the p-type guard ring regions 6 are equal to each other.

First, in the process illustrated in FIG. 8(a), a resist film is formed on the semiconductor substrate 1. Then, the resist film which covers the semiconductor substrate 1 is patterned by photolithography and etching to form an ion implantation resist mask 25 in which portions corresponding to the p-type guard ring regions 6 are opened. In this case, when side etching occurs in the resist mask 25, a guard ring pattern which has a smaller width than a guard ring pattern of a photomask (design value), such as a reticle used in photolithography, is formed (which is represented by a dotted line).

Although not illustrated in the drawings, when the oxide film mask is used as the ion implantation mask to form the p-type guard ring region 6, first, an oxide film is formed on the semiconductor substrate 1 and a resist film is formed on the oxide film. Then, the resist film is patterned by photolithography and etching to a resist mask for etching the oxide film. Then, the oxide film may be etched by the resist mask for etching to form the oxide film mask.

Then, in the process illustrated in FIG. 8(b), ions of p-type impurities 26, such as boron (B) ions, are implanted using the resist mask 25 as a mask and a heat treatment is performed to form the p-type guard ring regions 6 in portions of the semiconductor substrate 1 which are exposed through opening portions of the resist mask 25. In this case, when side etching occurs in the resist mask 25, the width of the p-type guard ring region 6 formed in the semiconductor substrate 1 is increased by the amount of side etching of the resist mask 25 by the side etching. Therefore, the gap between the p-type guard ring regions 6 is less than that when no side etching occurs in the resist mask 25 (which is represented by a dotted line).

Then, in the process illustrated in FIG. 8(c), the field oxide film 9 is formed on the semiconductor substrate 1 having the p-type guard ring regions 6 formed therein. Then, a polysilicon film (n− layer) 28 which is doped with an n-type impurity, such as a phosphorus (P) with a low impurity concentration, is formed on the field oxide film 9. Then, although not illustrated in the drawings, a portion of the polysilicon film 28 in which the protective diode 10 will be formed remains and a portion of the polysilicon film 28 other than the portion in which the protective diode 10 will be formed is removed by etching. FIG. 8(c) illustrates a state in which no side etching occurs in the ion implantation mask for forming the p-type guard ring region 6 (which holds for FIG. 8(d)).

Then, in the process illustrated in FIG. 8(d), p-type impurity ions, such as boron ions, are implanted into the polysilicon film 28 with a large dose using the ion implantation mask (not illustrated) in which portions corresponding to regions for forming the p+ layers 19 are opened. Then, n-type impurity ions, such as phosphorus ions, are implanted with a large dose into contact portions between the protective diode 10, and the gate wire and the stopper electrode, using another ion implantation mask in which portions corresponding to the regions for forming the p+ layers 19 are opened. A portion of the polysilicon film 28 which is covered with the ion implantation mask remains as the n− layer 20.

Then, a heat treatment is performed on the entire semiconductor substrate 1 on which the polysilicon film 28 doped with impurities is formed. Then, the series pn zener diode 18 in which the p+ layers 19 and the n− layers 20 are alternately arranged in the direction from the active region 21 to the outer circumference of the chip is formed. In this way, the protective diode 10 including the series pn zener diode 18 in which the p+ layers 19 and the n− layers 20 each having an impurity concentration of, for example, 1019/cm3 or more is completed. In this case, the n+ layers 22 which will be contact portions provided at both ends of the protective diode 10 are also formed during the ion implantation process for forming the series pn zener diode 18 and have a high impurity concentration, in order to ensure ohmic properties. In addition, when the protective diode 10 including the p+ layer 19, the n− layer 20, and the n+ layer 22 is formed as in Example 2, the n+ layers 22 which will be the contact portions provided at both ends of the protective diode 10 may be formed at the same time as the n+ layer 22 forming the protective diode 10.

In order to increase the breakdown voltage, the n− layer 20 may be formed in a three-layer structure in which three layers, that is, an n− layer, an n+ layer, and an n− layer are arranged in parallel in the direction from the active region 21 to the outer circumference of the chip. In this case, for the polysilicon film 28, an n+ layer with a high impurity concentration is selectively formed in an n− layer in which phosphorus is diffused at a low concentration by ion implantation to form the n− layer 20 with a three-layer structure of the n− layer, the n+ layer, and the n− layer. A high-concentration p+ layer 19 may be formed so as to adjacent to the n− layers which are provided at both ends of the n− layer 20 with the three-layer structure. The n+ layers 22 which will be the high-concentration n-type layers in the contact portions provided at both ends of the protective diode 10 may be formed at the same time as the n+ layer with a high impurity concentration in the n− layer 20 with the three-layer structure is formed. The series pn zener diode 18 which is formed in this way has a four-layer structure of the p+ layer, the n− layer, the n+ layer, and the n− layer. The series pn zener diodes 18 are repeatedly arranged to form the protective diode 10. The junction between the p+ layer and the n− layer in the series pn zener diode 18 having the four-layer structure of the p+ layer, the n− layer, the n+ layer, and the n− layer is not a zener junction, but is a general pn junction.

In the process illustrated in FIG. 8(a), when side etching occurs in the resist mask 25 due to etching, the width of the opening portion of the resist mask 25 for implanting, for example, boron in order to form the p-type guard ring region 6 is greater than the design value, as described above. When the oxide film mask is used as the ion implantation mask instead of the resist mask 25, the amount of side etching of the resist mask for etching, which is the oxide film mask, is added to the amount of removal (the amount of side etching) of the oxide film mask by side etching.

When side etching occurs in the resist mask 25, the width of the p-type guard ring region 6 is greater than the design value and the gap between the p-type guard ring regions 6 is reduced in the process illustrated in FIG. 8(b). Therefore, the potential of the outermost guard ring 6e in the p-type guard ring region 6 is less than the design value. The reduction in the potential is in the range of 7 V to 50 V and is determined by the amount of side etching of the resist mask 25. When the amount of side etching of the resist mask 25 is small, a potential reduction of 7 V corresponding to one series pn zener diode 18 occurs. When the amount of side etching of the resist mask 25 is about 3 μm, a potential of 50 V is reduced. For example, when the amount of side etching of the resist mask 25 is about 2.5 μm, a potential of about 40 V is reduced.

In the processes illustrated in FIGS. 8(c) and 8(d), the protective diode 10 may be formed as described above in order to the protective diode 10 of the semiconductor device 200 according to Example 2. Attention is paid to a portion interposed between the outermost guard ring 31e in the first guard ring region 31 and the adjacent guard ring 31d which is provided inside the guard ring 31e. The p+ layer 19 or the n− layer 20 may replace the series pn zener diodes 18 (about one to seven series pn zener diodes 18) corresponding to a potential of 7 V to 50 V among the series pn zener diodes 18 forming the protective diode 10 which is provided immediately above the portion. The series of processes makes it possible to approximate the potential of the protective diode 10 to the potential of the outermost guard ring 31e in the first guard ring region 31 after manufacture. As a result, it is possible to reduce the concentration of the electric field on the outermost guard ring 31e in the first guard ring region 31, as described above.

As described above, according to Embodiment 1, in the semiconductor device in which the guard rings are provided below the protective diode (below the surface of the protective diode which faces the semiconductor substrate, with the field oxide film interposed therebetween), since the polyimide film is provided as the surface protective film, it is possible to form the surface protective film, without using a resistive SiN film. Therefore, it is possible to prevent the occurrence of cracks in the surface protective film, to prevent a reduction in reliability, or to prevent an adverse effect on electrical characteristics. In addition, according to Embodiment 1, since the guard rings are provided below the protective diode, it is possible to reduce the concentration of the electric field on the outermost guard ring below the protective diode when a surge voltage is applied.

Embodiment 2

Figure 12A:
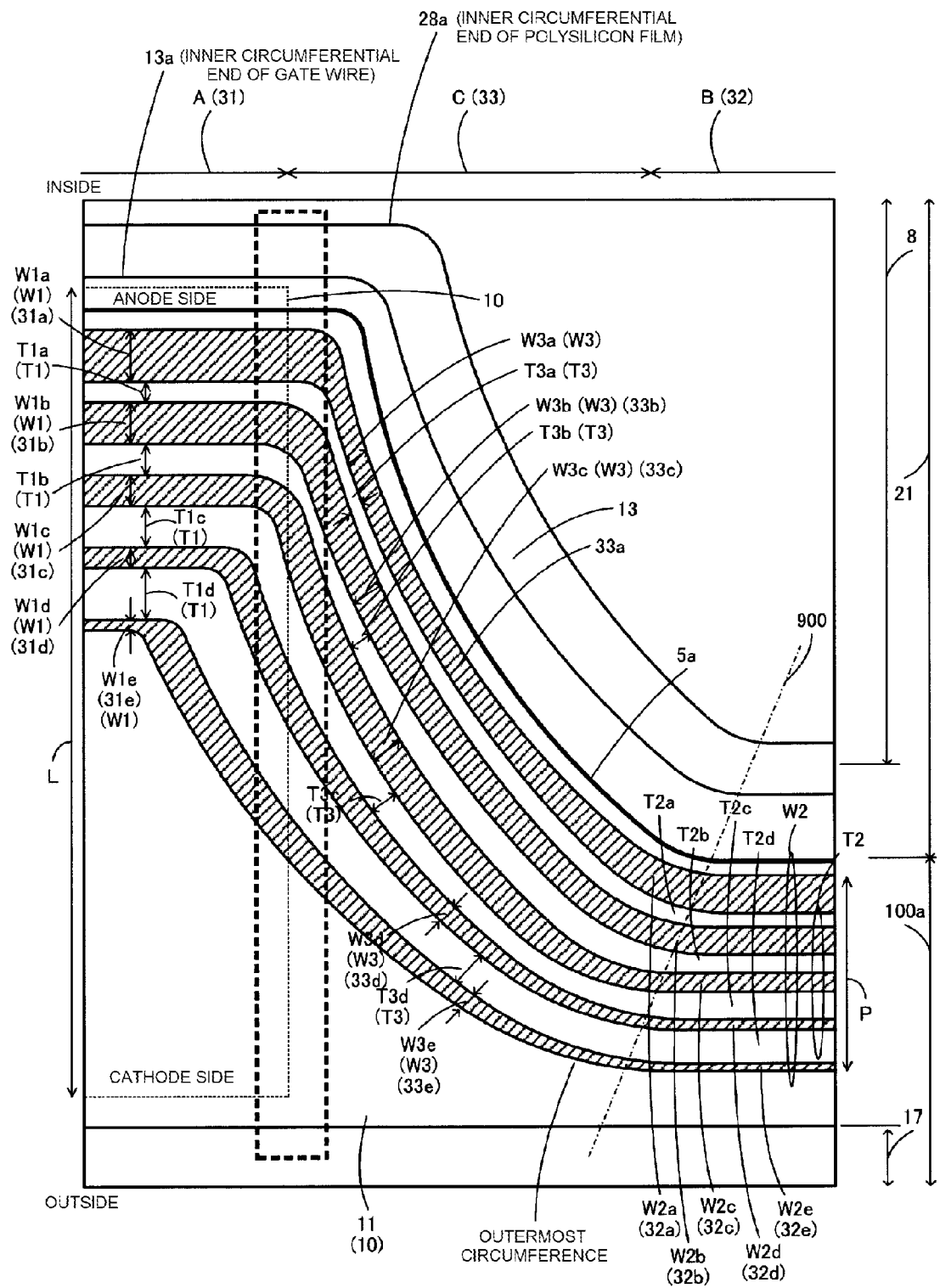
FIG. 12A is an enlarged plan view illustrating a main portion of a semiconductor device according to Embodiment 2.

Next, the structure of a semiconductor device according to Embodiment 2 will be described. FIG. 12A is an enlarged plan view illustrating a main portion of the semiconductor device according to Embodiment 2. The semiconductor device according to Embodiment 2 differs from the semiconductor device according to Embodiment 1 in that a first guard ring region 31 in a section A is connected to second and third guard ring regions 32 and 33 in sections C and B while a width W1 of the first guard ring region 31 is maintained at a substantially constant value. That is, the semiconductor device according to Embodiment 2 differs from the semiconductor device according to Embodiment 1 in that the rectangular region (potential fixed portion) with a large area which is provided in the third guard ring region 33 in order to fix the potential of the guard ring is omitted.

The width W1 (W1a, W1b, W1c, W1d, and W1e) of the first guard ring region 31 is equal to a width W2 (W2a, W2b, W2c, W2d, and W2e) of the second guard ring region 32 and a width W3 (W3a, W3b, W3c, W3d, and W3e) of the third guard ring region 33. In addition, a gap T1 (T1a, T1b, T1c, and T1d) between the first guard ring regions 31 is equal to a gap T2 (T2a, T2b, T2c, and T2d) between the second guard ring regions 32 and a gap T3 (T3a, T3b, T3c, and T3d) between the third guard ring regions 33. That is, the guard rings are arranged in the sections A to C such that W1a=W2a=W3a, W1b=W2b=W3b, W1c=W2c=W3c, W1d=W2d=W3d, and W1e=W2e=W3e are satisfied and T1a=T2a=T3a, T1b=T2b=T3b, T1c=T2c=T3c, and T1d=T2d=T3d are satisfied.

The widths W1, W2, and W3 of the first to third guard ring regions 31 to 33 are reduced toward an n-type stopper region 16 (a region in which a collector potential is reflected). The gaps T1, T2, and T3 between the first to third guard ring regions 31 to 33 increase toward the n-type stopper region 16. That is, guard rings 31a to 31e of the first guard ring regions 31 in the section A are arranged such that W1a>W1b>W1c>W1d>W1e and T1a<T1b<T1c<T1d are satisfied. Guard rings 32a to 32e of the second guard ring regions 32 in the section B are arranged such that W2a>W2b>W2c>W2d>W2e and T2a<T2b<T2c<T2d are satisfied. Guard rings 33a to 33e of the third guard ring regions 33 in the section C are arranged such that section W3a>W3b>W3c>W3d>W3e and T3a<T3b<T3c<T3d are satisfied.

As such, the widths W1, W2, and W3 of the first to third guard ring regions 31 to 33 are substantially constant and the gap T1, T2, and T3 between the first to third guard ring regions 31 to 33 are substantially constant. Therefore, the distance between the outermost guard ring 32e in the second guard ring region 32 and the n-type stopper region 16 is greater than that in Embodiment 1.

Next, the structure of the first and third guard ring regions 31 and 33 in the vicinity of the boundary between the section A and the section C will be described. FIG. 12B is an enlarged view illustrating a dashed frame portion illustrated in FIG. 12A. FIGS. 12C and 12D are enlarged views illustrating another example of the dashed frame portion illustrated in FIG. 12A. In FIGS. 12B to 12D, an enlarged plan view illustrating the dashed frame portion illustrated in FIG. 12A is illustrated on the right side and a cross-sectional view taken along the line X-X' of the plan view is illustrated on the left side. The cross-sectional structures taken along the line X-X' of FIGS. 12B to 12D are the same as those in Embodiment 1 (see FIGS. 13(a) and 13(b)).

In the structure illustrated in FIG. 12B, the protective diode 10 is connected to a polysilicon field plate 10a which is provided on the guard rings 33a to 33e in the third guard ring regions 33 between the section A and the section B (that is, in the section C). According to this structure, similarly to Embodiment 1, an equipotential surface can be less likely to be affected by the external charge.

The structure illustrated in FIG. 12C differs from the structure illustrated in FIG. 12B in the following two points. The first difference is that the structure includes a separation portion 10b which separates polysilicon of the protective diode 10 from the polysilicon field plate 10a provided above each of the guard rings 33a to 33e in the third guard ring regions 33. The second difference is that the polysilicon of the protective diode 10 and the polysilicon field plates 10a above the guard rings 33a to 33e are arranged in a comb shape. According to this structure, similarly to Embodiment 1, the potential of the protective diode 10 is independent of the potential of the polysilicon field plate 10a above the guard rings 33a to 33e and is less likely to be affected by the potential of the polysilicon field plate 10a.

The structure illustrated in FIG. 12D differs from the structure illustrated in FIG. 12C in that the separation portion 10b which separates the polysilicon of the protective diode 10 from the polysilicon field plate 10a is linearly arranged from the inner circumference to the outer circumference of the chip. Therefore, potential is likely to be linearly changed. However, similarly to Embodiment 1, when the separation distance of the separation portion 10b between the polysilicon of the protective diode 10 and the polysilicon field plate 10a is equal to or less than 10 µm, preferably, equal to or less than 2 µm, the separation portion is less likely to be affected by the external charge and it is easy to design a planar layout.

Figure 14:
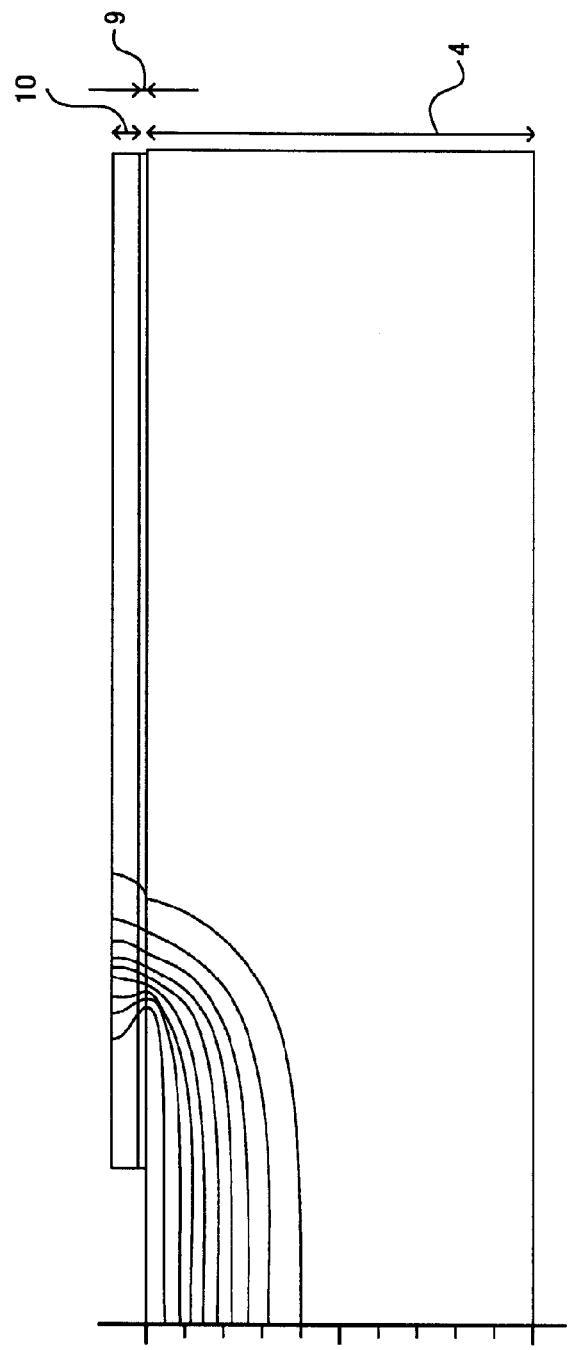
FIG. 14 is a cross-sectional view illustrating the device simulation result of an electrostatic potential distribution when a forward bias is applied to an IGBT having a gate in an off state in a structure in which a protective diode 10 is not provided and only a section B is two-dimensionally modeled from an active region to the outer circumference of a chip.
Figure 15:
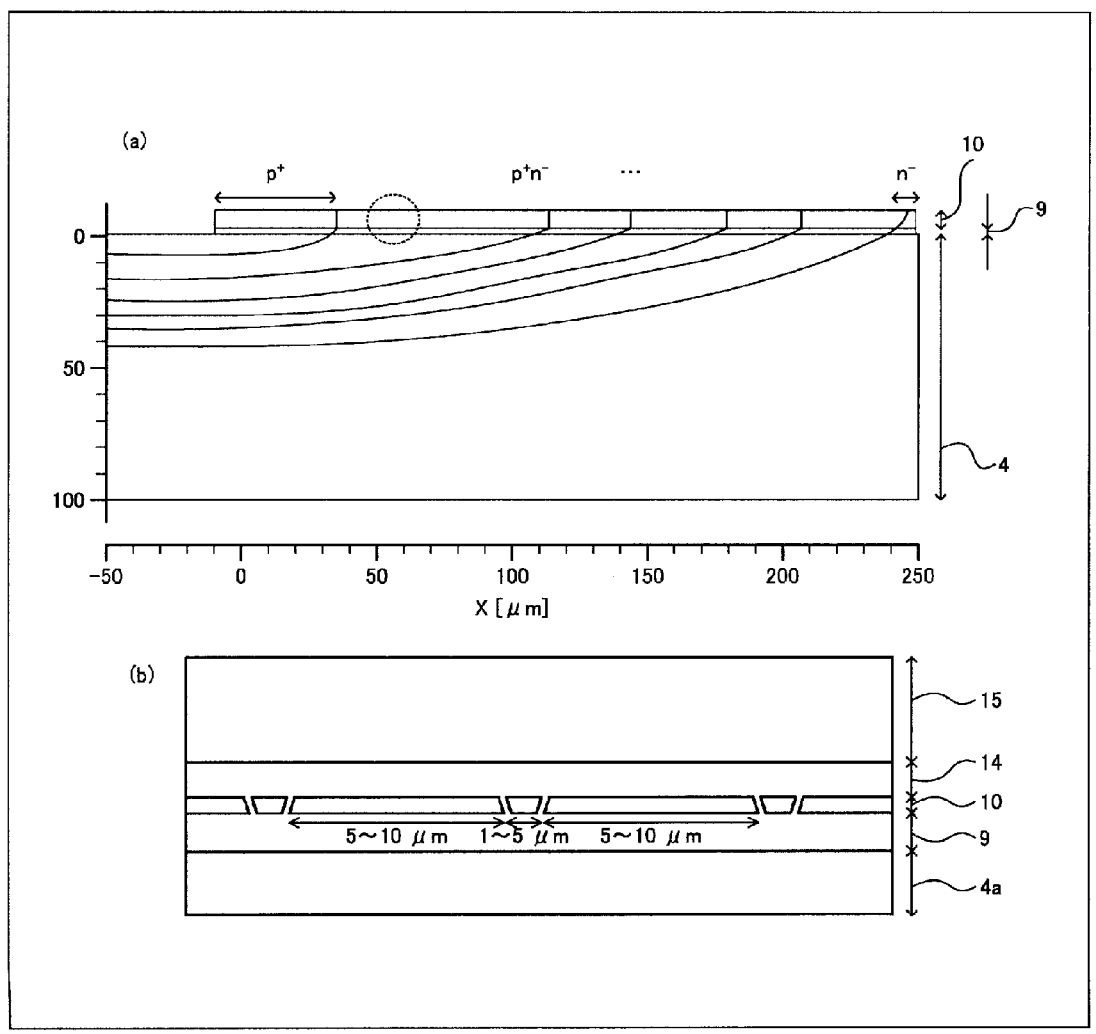
FIG. 15 is a cross-sectional view illustrating the device simulation result of an electrostatic potential distribution when a forward bias is applied to an IGBT having a gate in an off state in a structure in which only a section A is two-dimensionally modeled from an active region to the outer circumference of a chip and a protective diode 10 is provided immediately above a termination structure region without a guard ring.

Next, the equipotential line density (electric field intensity) reduction effect of the structure in which a zener diode (protective diode 10) is formed on a termination structure region 100a will be described with reference to FIGS. 14 and 15. FIG. 14 is a cross-sectional view illustrating the device simulation result of an electrostatic potential distribution when a forward bias is applied to an IGBT having a gate in an off state in a structure in which the protective diode 10 is not provided and only the section B is two-dimensionally modeled in a direction from the active region to the outer circumference of the chip. FIG. 15 is a cross-sectional view illustrating the device simulation result of an electrostatic potential distribution when a forward bias is applied to the IGBT having a gate in an off state in a structure in which only the section A is two-dimensionally modeled in the direction from the active region to the outer circumference of the chip and the protective diode 10 is provided immediately above a termination structure region without a guard ring. In FIGS. 14 and 15, the protective diode 10 is not illustrated and a p-type guard ring region is not illustrated for simplicity of illustration. The device simulation result shows that the breakdown voltage (rated voltage) of the termination structure region of the semiconductor device illustrated in FIG. 14 is 324 V and the breakdown voltage (rated voltage) of the termination structure region of the semiconductor device illustrated in FIG. 15 is 560 V.

The result illustrated in FIG. 14 shows that, when the protective diode 10 is not provided, the density of equipotential lines in a p-type base region end portion 5a is high and the electric field is concentrated. As a result, avalanche breakdown occurs. A one-dimensional breakdown voltage which is obtained by a structure including a p-type base region 5 and an n-type drift region 4 is 600 V only in the depth direction. Therefore, the breakdown voltage is reduced by the concentration of the electric field on the p-type base region end portion 5a.

The result illustrated in FIG. 15 proved that, when the protective diode 10 was provided immediately above a portion corresponding to the first guard ring region 31 in the section A, an electrostatic potential was sufficiently applied to the region in which the series pn zener diode was formed and the electric field could be reduced. As a result, when a device was formed only in the section C, the breakdown voltage of the termination structure region was equal to or greater than 560 V. This is because the series pn zener diode 18 forming the potential of the protective diode 10 increases linearly with respect to the distance in the direction from the active region 21 with a potential of 0 V to the outer circumference of the chip with a potential corresponding to the voltage applied. Simply, when a voltage is applied between the cathode and anode electrodes of the protective diode 10, the breakdown voltage is 680 V. When the protective diode 10 is formed above the termination structure region of the IGBT over the length L illustrated in FIG. 2A, the equipotential lines are linearly (uniformly) distributed over the length L. That is, as illustrated in FIG. 15, when protective diode 10 (series pn zener diode 18) is formed above the termination structure region of the IGBT, the protective diode 10 forces the equipotential lines to be uniformly distributed over the length L. Then, equipotential lines in the semiconductor substrate are attracted to the equipotential lines. Therefore, the concentration of the electric field on the p-type base region end portion 5a is reduced in FIG. 14. As a result, the breakdown voltage increases up to 560 V.

In practice, since the guard rings are formed in the termination structure region 100a of the IGBT as illustrated in FIGS. 1 and 2A, it is possible to further reduce the electric field. In particular, when the outermost guard ring is formed on the inner circumferential side of the protective diode 10, the potential can be pulled to the outermost guard ring by the effect of the series pn zener diode 18. Therefore, it is possible to reduce the electric field that is concentrated on the outer circumference of each guard ring including the outermost circumference, which is preferable.

Figure 16:
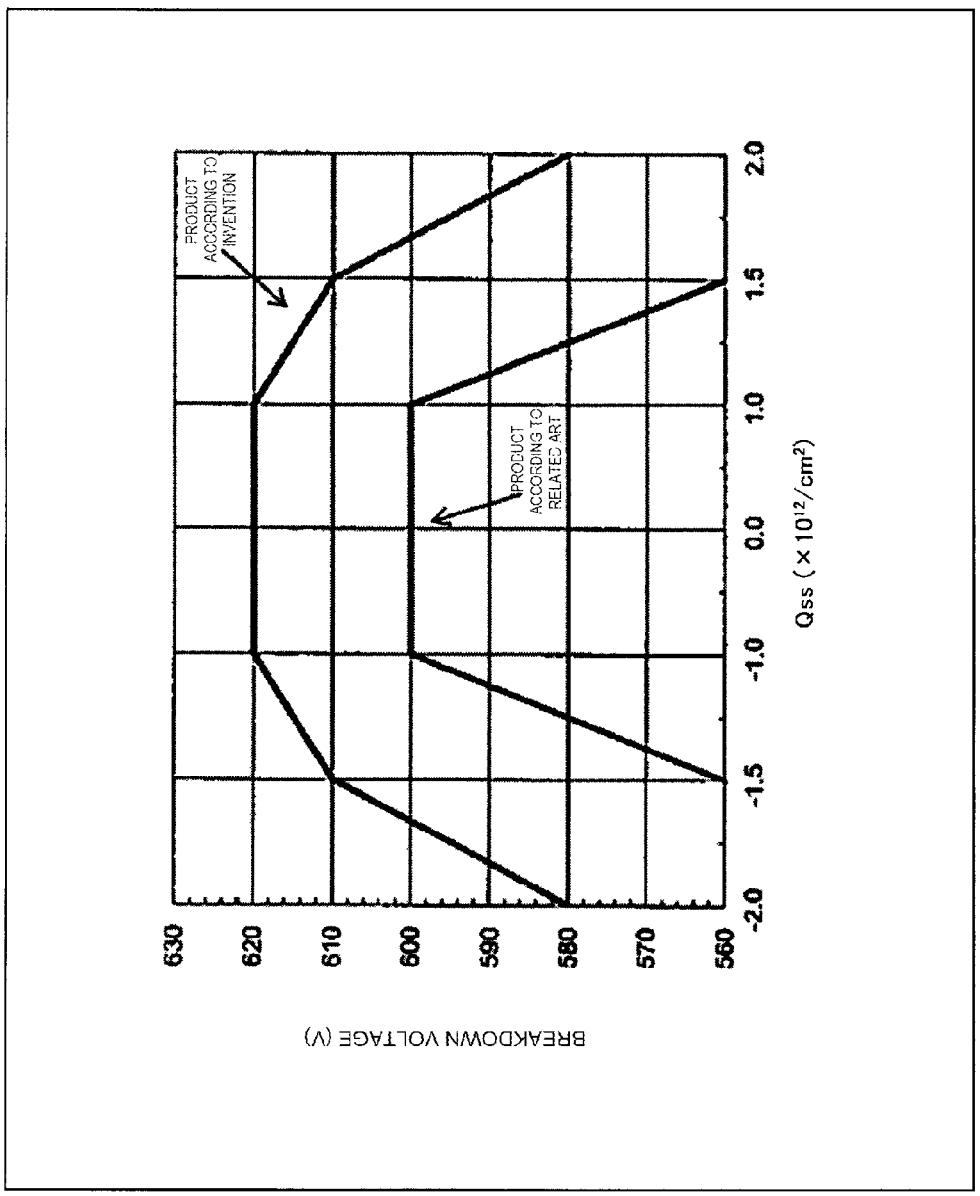
FIG. 16 is a diagram illustrating the charge resistance of the semiconductor device according to the invention.

Next, the charge resistance of the semiconductor device according to the invention will be described. FIG. 16 is a diagram illustrating the charge resistance of the semiconductor device according to the invention. A product according to the related art illustrated in FIG. 16 is the semiconductor device 500 according to the related art illustrated in FIG. 10. It was confirmed that charge resistance f was ±1.0×1012/cm2 at an initial breakdown voltage of 600 V. In contrast, a product according to the invention illustrated in FIG. 16 is the semiconductor device 100 according to the first example illustrated in FIG. 1 and it was confirmed that charge resistance was ±1.5×1012/cm2 at an initial breakdown voltage of 620 V. The inventors found that, when the polysilicon of the protective diode 10 and polysilicon above the guard rings 33a to 33e in the third guard ring regions 33 were arranged in a comb shape at the boundary between the section A and the section C as illustrated in FIG. 2C, it was possible to improve the initial breakdown voltage by 20 V and to set the charge resistance f to ±1.5×1012/cm2 (not illustrated).

As described above, according to Embodiment 2, it is possible to obtain the same effect as that in Embodiment 1.

Various modifications and changes of the invention can be made without departing from the scope and spirit of the invention. In each of the above-described embodiments, for example, the dimensions or surface concentration of each component can be set depending on required specifications. In addition, in each of the above-described embodiments, the conductivity types (an n type and a p type) may be reversed. In this case, the same effect as described above is obtained.

As described above, the semiconductor device according to the invention is used as a semiconductor device in which a power semiconductor element and a protective diode for protecting the power semiconductor element from a surge voltage that is applied from the outside or a surge voltage, such as electromagnetic noise that is generated from the power semiconductor element during switching, are formed on the same semiconductor substrate.

What is claimed is:

1. A semiconductor device, comprising:
a semiconductor substrate of a first conductivity type;
a semiconductor element that is provided on the semiconductor substrate and that includes an active region in which a main current flows and a termination structure region which surrounds the active region;
a protective diode that is provided above the termination structure region, with an insulating film interposed there between, and that includes a plurality of diodes which are formed by alternately arranging first-conductivity-type semiconductor layers and second-conductivity-type semiconductor layers so as to be adjacent to each other in a direction from the active region to a peripheral region of the semiconductor substrate, one end of the protective diode being electrically connected to a high-potential electrode which is provided on an outer circumferential side of the semiconductor element, and another end of the protective diode being electrically connected to a gate wire of the semiconductor element which is provided on the active region side;
at least one diffusion layer of a second conductivity type that is selectively provided in a surface layer of a surface of the semiconductor substrate, which comes into contact with the insulating film, so as to surround the active region in the termination structure region, an outermost diffusion layer of the at least one diffusion layer having an outer circumferential end outside of which said one end of the protective diode is disposed; and
a surface protective film that covers the termination structure region,
wherein the termination structure region is divided into a first section in which the protective diode is arranged, a second section which has a width that is smaller than that of the first section, and a third section that connects the first section and the second section, and that has a width that decreases from the first section toward the second section, and
wherein the at least one diffusion layer has a ring shape in a plan view which includes a first portion that is arranged in the first section and faces the protective diode in a depth direction, a second portion that is arranged in the second section, that is disposed closer to the outer circumference of the semiconductor substrate than the first portion, and that has a surface area that is greater than that of the first portion, and a third portion that is arranged in the third section.

2. The semiconductor device according to claim 1, wherein, in the at least one diffusion layer that has a ring shape in a plan view, all portions thereof are connected to each other and form a guard ring.

3. The semiconductor device according to claim 1, wherein the first portion of the at least one diffusion layer has a width that is greater than that of the second portion of the at least one diffusion layer.

4. The semiconductor device according to claim 1, wherein the at least one diffusion layer includes a plurality of diffusion layers arranged at predetermined intervals in the direction from the active region to the outer circumferential side of the semiconductor element, and wherein adjacent diffusion layers in the first portion have an interval there between that is larger than that between adjacent layers in the second portion.

5. The semiconductor device according to claim 1, wherein the at least one diffusion layer includes two or more diffusion layers arranged at a predetermined interval in the direction from the active region to the outer circumferential side of the semiconductor element, and wherein the first-conductivity-type semiconductor layer or the second-conductivity-type semiconductor layer is provided above a surface of a portion of the semiconductor substrate which is interposed between the adjacent diffusion layers, with the insulating film interposed there between.

6. The semiconductor device according to claim 1, wherein the diode is a zener diode.

7. The semiconductor device according to claim 1, wherein the protective diode is made of polysilicon.

8. The semiconductor device according to claim 1, wherein the surface protective film is made of a polyimide-based resin.

9. The semiconductor device according to claim 1, wherein the semiconductor element is an insulated gate bipolar transistor or an insulated gate field effect transistor.

10. The semiconductor device according to claim 1, wherein the third portion has a curved shape in a plan view which is convex toward the outer circumference of the semiconductor substrate.

11. The semiconductor device according to claim 10, wherein a part of the third portion of the at least one diffusion layer which is close to the second section of the termination structure region has a curvature that increases toward a first section of the termination structure region.

12. The semiconductor device according to claim 1, further comprising a polysilicon field plate that is provided above a surface of the third portion of the at least one diffusion layer, with the insulating film interposed there between.

13. The semiconductor device according to claim 12, wherein the at least one diffusion layer has a width that is reduced toward the outer circumference of the semiconductor substrate, and wherein the at least one diffusion layer includes two or more diffusion layers that define a gap there between which increases toward the outer circumference of the semiconductor substrate.

14. The semiconductor device according to claim 12, wherein the protective diode is connected to the polysilicon field plate.

15. The semiconductor device according to claim 12, wherein a portion of the protective diode which faces the polysilicon field plate has a comb-shape in a plan view and is a comb-shaped portion, and wherein the polysilicon field plate has a comb-shape in a plan view which corresponds to unevenness of the comb-shaped portion of the protective diode and is separated from the protective diode.

16. The semiconductor device according to claim 12, wherein the protective diode is separated from the polysilicon field plate, and wherein a region between the protective diode and the polysilicon field plate has a linear shape in a plan view which extends from the inner circumference to the outer circumference of the semiconductor substrate.

17. The semiconductor device according to claim 1, wherein, in the protective diode, the first-conductivity-type semiconductor layer or the second-conductivity-type semiconductor layer is provided above a surface of a portion of the semiconductor substrate that is interposed between an outermost first portion and an adjacent first portion which is arranged inside the outermost first portion.

18. The semiconductor device according to claim 1, wherein the third portion of the at least one diffusion layer includes:

a first region that has a curved shape in a plan view which is convex toward the outer circumference of the semiconductor substrate; and a second region that has a rectangular shape, that has a width that is broader than the first portion in a direction from the active region toward a circumferential region of the semiconductor substrate, and that is arranged adjacent to the first portion between the first region and the first portion.

19. The semiconductor device according to claim 1, wherein the first portion, the second portion, and the third portion of the at least one diffusion layer have respective widths that are the same.

20. A semiconductor device, comprising:
a semiconductor substrate of a first conductivity type;
a semiconductor element that is provided on the semiconductor substrate and that includes an active region in which a main current flows and a termination structure region which surrounds the active region;
a protective diode that is provided above the termination structure region, with an insulating film interposed there between;
at least one diffusion layer of a second conductivity type that is selectively provided in a surface layer of a surface of the semiconductor substrate, which comes into contact with the insulating film, so as to surround the active region in the termination structure region, and an outermost diffusion layer of the at least one diffusion layer having an outer circumferential end outside of which one end of the protective diode is disposed; and
a surface protective film that covers the termination structure region,
wherein the protective diode includes a plurality of diodes which are formed by alternately arranging first-conductivity-type semiconductor layers and second-conductivity-type semiconductor layers so as to be adjacent to each other in a direction from the active region to a peripheral region of the semiconductor substrate, said one end of the protective diode is electrically connected to a high-potential electrode which is provided on an outer circumferential side of the semiconductor element, and another end of the protective diode is electrically connected to a gate wire of the semiconductor element which is provided on the active region side.

* * * * *